United States Patent
Kimura

(10) Patent No.: US 12,360,215 B2
(45) Date of Patent: Jul. 15, 2025

(54) PHOTODETECTION ELEMENT AND LIDAR DEVICE

(71) Applicant: DENSO CORPORATION, Kariya (JP)

(72) Inventor: Shunsuke Kimura, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 18/400,436

(22) Filed: Dec. 29, 2023

(65) Prior Publication Data
US 2024/0134013 A1 Apr. 25, 2024
US 2024/0230850 A9 Jul. 11, 2024

Related U.S. Application Data

(60) Division of application No. 17/156,206, filed on Jan. 22, 2021, which is a continuation of application No. PCT/JP2019/028788, filed on Jul. 23, 2019.

(30) Foreign Application Priority Data

Jul. 25, 2018 (JP) .................. 2018-139607
Jul. 25, 2018 (JP) .................. 2018-139608

(51) Int. Cl.
*G01S 7/481* (2006.01)
*G01S 17/88* (2006.01)
(Continued)

(52) U.S. Cl.
CPC .......... *G01S 7/4816* (2013.01); *G01S 7/4817* (2013.01); *G01S 17/88* (2013.01); *G02B 26/105* (2013.01);
(Continued)

(58) Field of Classification Search
CPC ......... H01L 27/14623; H01L 27/14627; H01L 27/14636; G02B 26/105; G01S 77/4816;
(Continued)

(56) References Cited

U.S. PATENT DOCUMENTS

2007/0279661 A1 12/2007 Misawa
2009/0160989 A1* 6/2009 Lauxtermann ......... H04N 25/59
    348/308
(Continued)

FOREIGN PATENT DOCUMENTS

JP 2011-097418 A 5/2011
JP 2011-247872 A 12/2011
(Continued)

OTHER PUBLICATIONS

U.S. Appl. No. 17/156,206, filed Jan. 22, 2021, Pending.
U.S. Appl. No. 17/156,206 and its entire file history.

*Primary Examiner* — Thanh Luu
(74) *Attorney, Agent, or Firm* — Maschoff Brennan

(57) ABSTRACT

A photodetection element includes a pixel region, a first absorption region, a first discharge electrode, a pixel neighboring region, a second absorption region, and a second discharge electrode. The pixel region is formed in a semiconductor substrate and internally generates an electron and a hole in accordance with the incident light. The pixel neighboring region is formed so as to be adjacent to the pixel region and internally generates an electron and a hole in accordance with the incident light. The second absorption region is formed in the pixel neighboring region and absorbs, of either of the electron and the hole generated in the pixel neighboring region, the carrier equal to a first discharge carrier as a second discharge carrier. The second discharge electrode is formed on the semiconductor substrate and discharges, from the second absorption region, the second discharge carrier absorbed in the second absorption region.

14 Claims, 26 Drawing Sheets

(51) Int. Cl.
*G02B 26/10* (2006.01)
*H10F 39/00* (2025.01)
*H10F 39/18* (2025.01)

(52) U.S. Cl.
CPC ......... *H10F 39/18* (2025.01); *H10F 39/8057* (2025.01); *H10F 39/8063* (2025.01); *H10F 39/811* (2025.01)

(58) Field of Classification Search
CPC .... G01S 77/4817; H10F 39/18; H10F 39/151; H10F 39/8057
See application file for complete search history.

(56) References Cited

U.S. PATENT DOCUMENTS

| | | |
|---|---|---|
| 2011/0102620 A1 | 5/2011 | Sakano et al. |
| 2011/0291218 A1 | 12/2011 | Yamamura et al. |
| 2013/0001724 A1 | 1/2013 | Masuda |
| 2013/0107016 A1* | 5/2013 | Federspiel ............... G01S 17/89 348/49 |
| 2018/0308883 A1 | 10/2018 | Yanagita et al. |
| 2021/0183930 A1* | 6/2021 | Takatsuka ......... H01L 27/14685 |

FOREIGN PATENT DOCUMENTS

| | | |
|---|---|---|
| JP | 2012-256782 A | 12/2012 |
| JP | 2016-017904 A | 2/2016 |

* cited by examiner

PHOTODETECTION ELEMENT AND LIDAR DEVICE

CROSS-REFERENCE TO RELATED APPLICATION

This application is a divisional application of U.S. Ser. No. 17/156,206 filed Jan. 22, 2021, which is based on and claims the benefit of priority from earlier Japanese Patent Application No. 2018-139607 filed Jul. 25, 2018 and earlier Japanese Patent Application No. 2018-139608 filed Jul. 25, 2018, the descriptions of which are incorporated herein by reference.

BACKGROUND

Technical Field

The present disclosure relates to a photodetection element that detects light and a lidar device that includes the photodetection element.

Related Art

A lidar device measures distances to objects around a vehicle by applying light toward an area around the vehicle and receiving reflected light of the applied light returning from the objects.

SUMMARY

As an aspect of the present disclosure, a photodetection element includes: at least one pixel region formed in a semiconductor substrate and configured to internally generate an electron and a hole in accordance with incident light; a first absorption region formed in the pixel region and configured to absorb a first discharge carrier, the first discharge carrier being either of the electron and the hole generated in the pixel region; a first discharge electrode formed on the semiconductor substrate and configured to discharge, from the first absorption region, the first discharge carrier absorbed in the first absorption region; a pixel neighboring region formed so as to be adjacent to the pixel region in the semiconductor substrate and configured to internally generate an electron and a hole in accordance with incident light; a second absorption region formed in the pixel neighboring region and configured to absorb a second discharge carrier, the second discharge carrier being a carrier that is either of the electron and the hole generated in the pixel neighboring region and equal to the first discharge carrier; and a second discharge electrode formed on the semiconductor substrate and configured to discharge, from the second absorption region, the second discharge carrier absorbed in the second absorption region.

DETAILED DESCRIPTION OF THE PREFERRED EMBODIMENTS

JP 2016-17904 A describes a lidar device that measures distances to objects around a vehicle by applying light toward an area around the vehicle and receiving reflected light of the applied light returning from the objects.

The inventors have conducted detailed research, and as a result, found that the lidar device described in JP 2016-17904 A has measurement accuracy lower for the distance to an object near to the lidar device than for the distance to an object far from the lidar device.

The present disclosure improves measurement accuracy of a lidar device.

First Embodiment

A first embodiment of the present disclosure will now be described with reference to the drawings.

A lidar device 1 according to the present embodiment is installed in a vehicle and used to detect various objects around the vehicle. Lidar is also written as LIDAR. LIDAR is an abbreviation for light detection and ranging.

Figure 1:
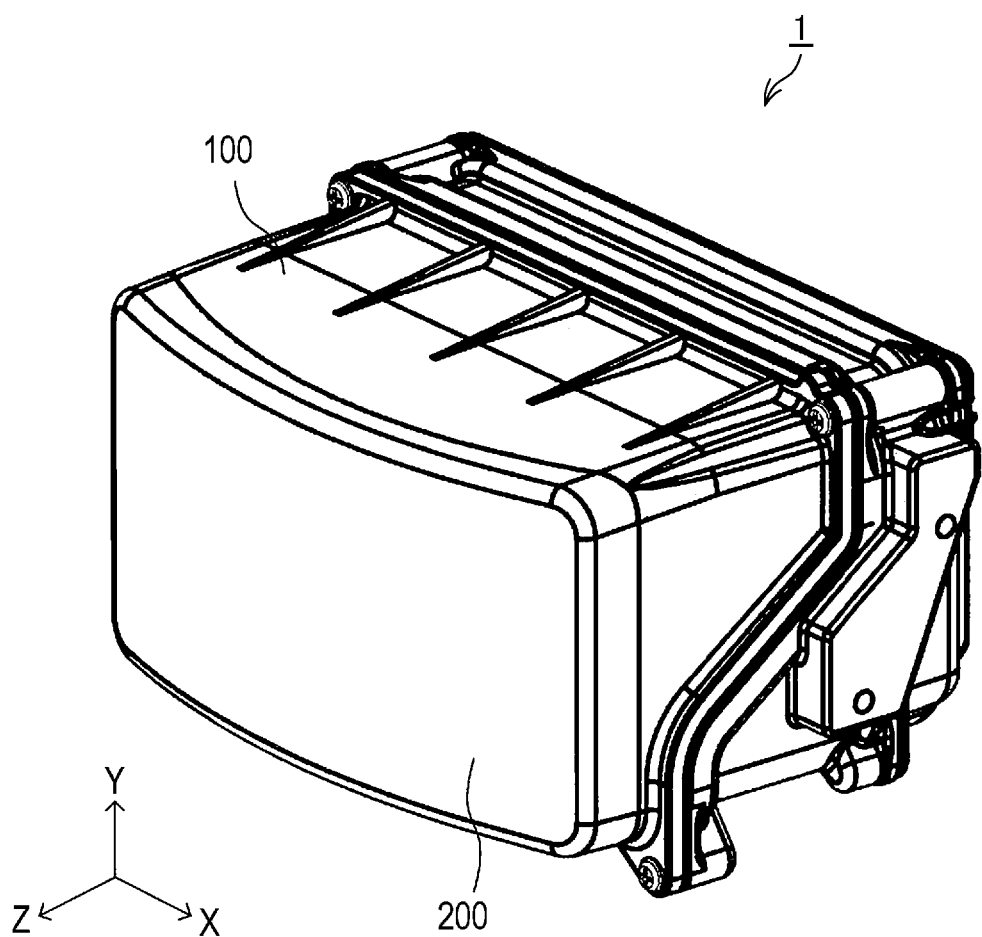
FIG. 1 is a perspective view of a lidar device.

The lidar device 1, as shown in FIG. 1, includes a housing 100 and an optical window 200.

The housing 100 is a rectangular resin box with an opening in one of its six surfaces and contains a photodetection module 2 described later.

The optical window 200 is a resin lid fixed to the housing 100 to cover the opening in the housing 100. The photodetection module 2 installed in the housing 100 emits a laser beam, which passes through the optical window 200.

Hereinafter, the direction along the length of the substantially rectangular opening is referred to as the X axis direction, the direction along the width of the opening is referred to as the Y axis direction, and the direction orthogonal to the X axis direction and the Y axis direction is referred to as the Z axis direction. Right and left in the X axis direction, and up and down in the Y axis direction are defined as viewed from the opening in the housing 100. In the Z axis direction, forward is defined as a direction from the depth toward the opening in the housing 100, and rearward is defined as a direction toward the depth.

Figure 2:
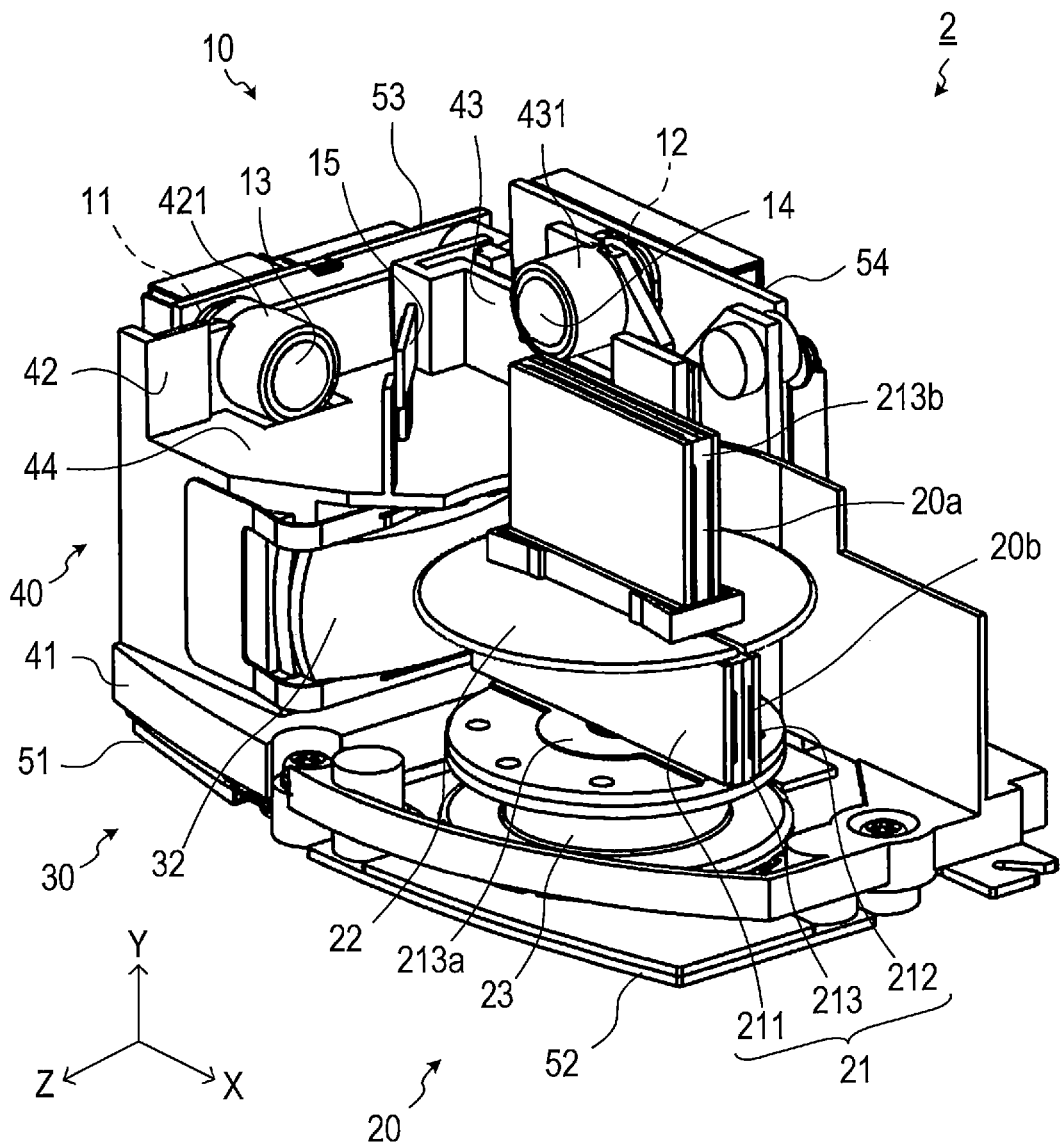
FIG. 2 is a perspective view of a photodetection module.
Figure 3:
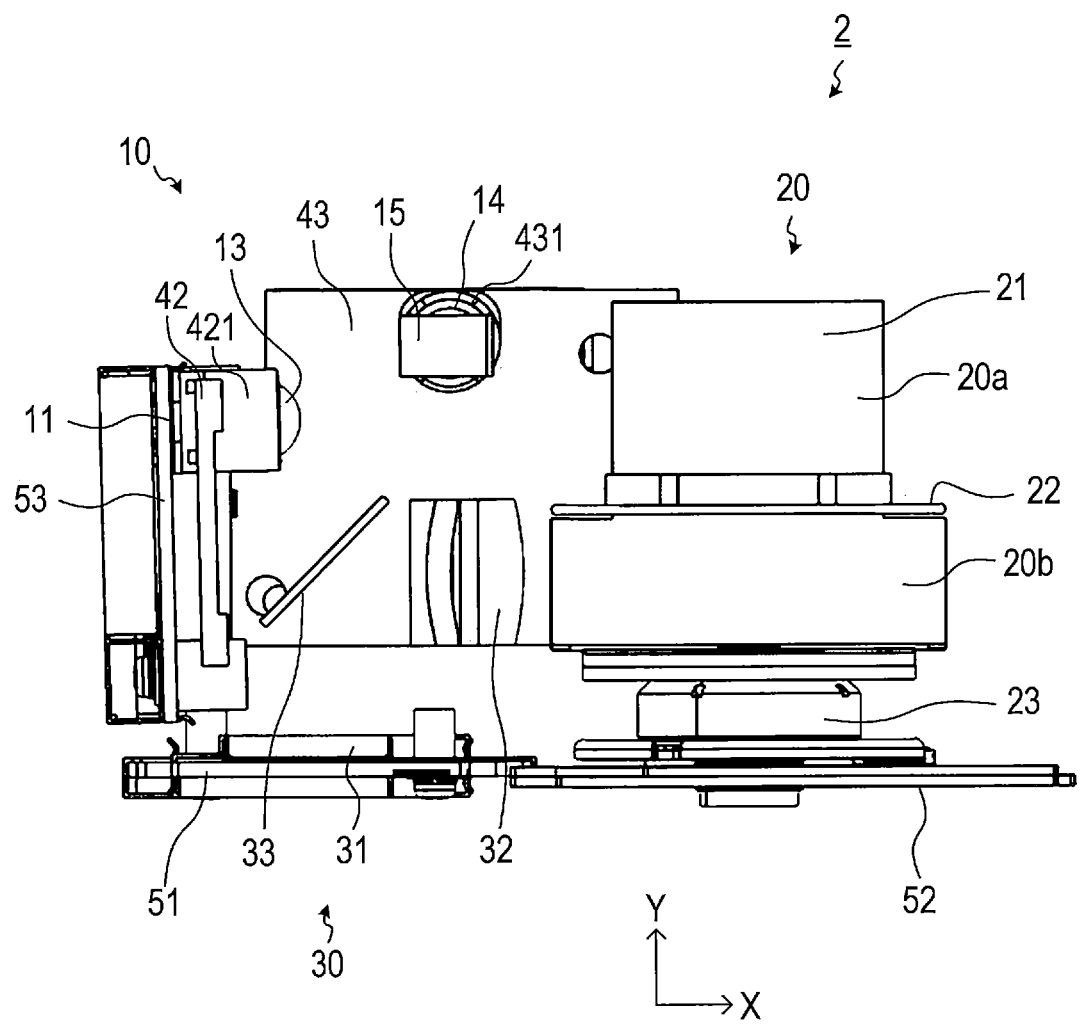
FIG. 3 is a front view of the photodetection module with a part of its frame not shown.
Figure 4:
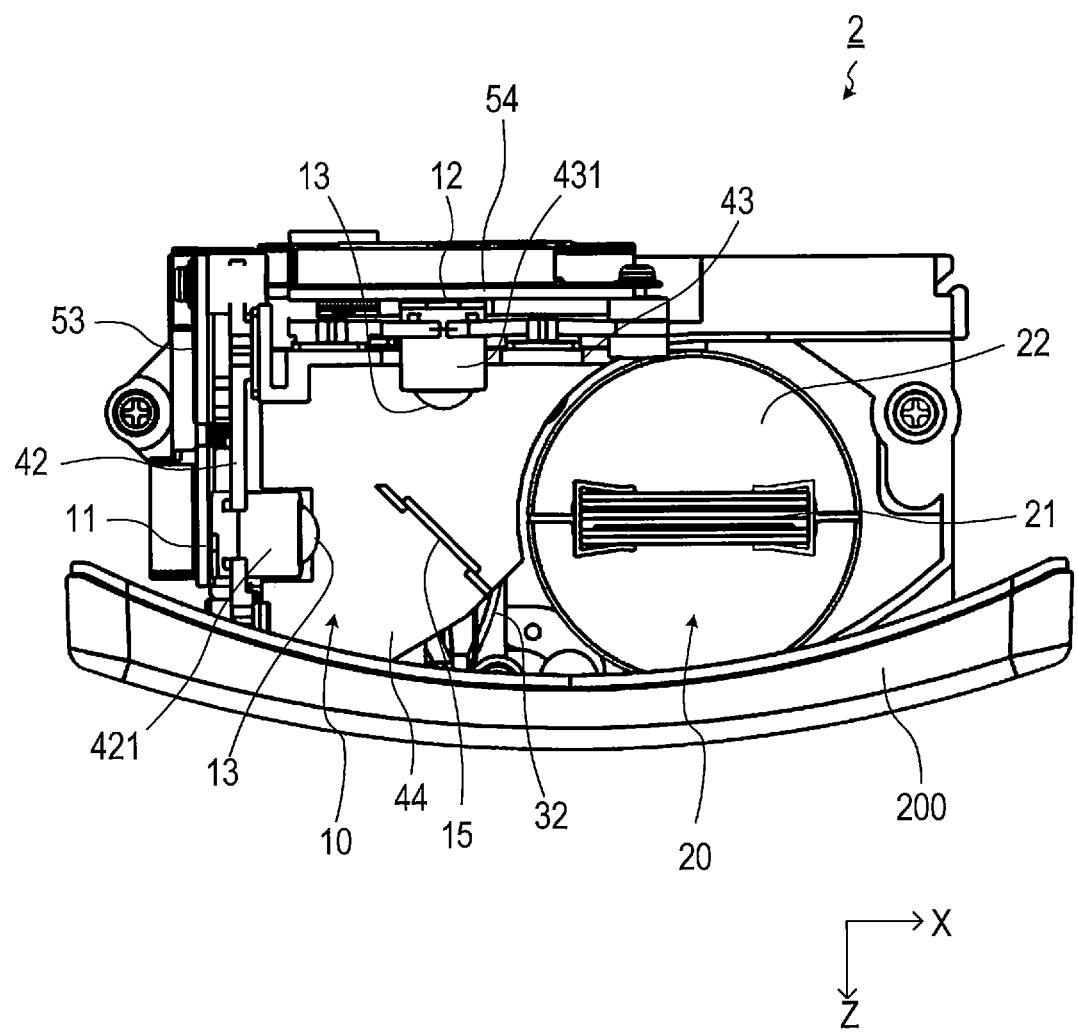
FIG. 4 is a plan view of the lidar device with its housing not shown.

The photodetection module 2, as shown in FIGS. 2, 3, and 4, includes a light emitting unit 10, a scanning unit 20, a light receiving unit 30, and a frame 40. The photodetection module 2 is installed in the housing 100 via the frame 40.

The scanning unit 20 includes a mirror module 21, a partition 22, and a motor 23.

Figure 5:
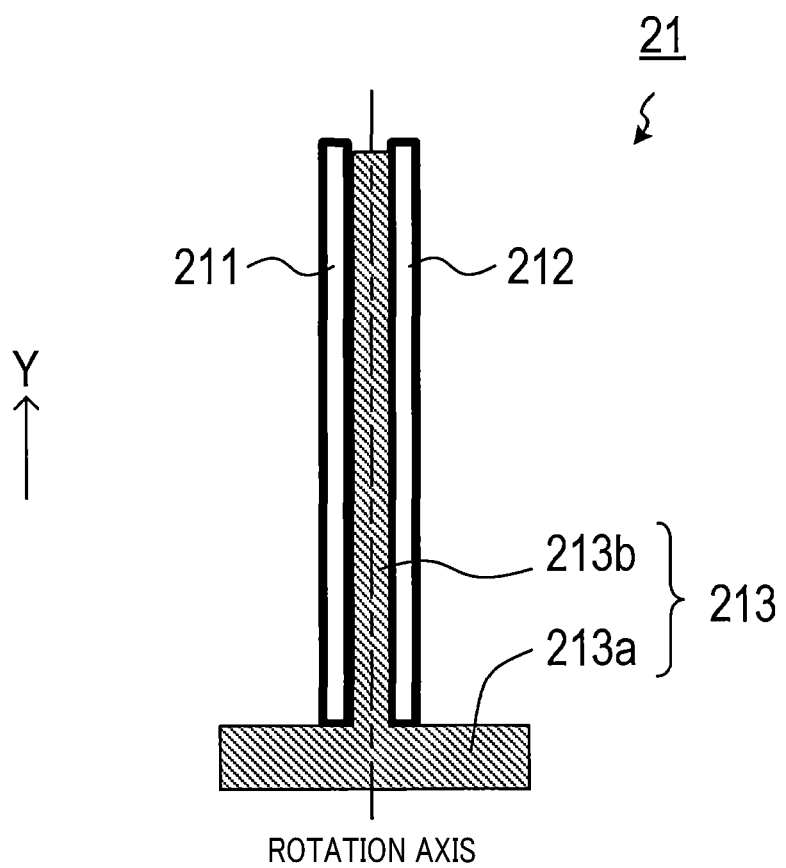
FIG. 5 shows a configuration of a mirror module.

The mirror module 21, as shown in FIG. 5, includes a pair of deflection mirrors 211 and 212 and a mirror frame 213.

The pair of deflection mirrors 211 and 212 are flat members each having a reflective surface that reflects light. The mirror frame 213 includes a circular plate 213a and a support 213b. The circular plate 213a is a disc-shaped portion and fixed to the rotational shaft of the motor 23 at the center of the circle. The support 213b is a plate member with the deflection mirrors 211 and 212 fixed on both sides. The support 213b protrudes from the circular surface of the circular plate 213a in a direction perpendicular to the circular surface of the circular plate 213a.

The deflection mirrors 211 and 212 and the support 213b each have an integrated shape of two rectangles with different lengths. More specifically, the deflection mirrors 211 and 212 and the support 213b have a shape of two integrated rectangles arranged along their central axes extending in the width direction, with the axes aligned with each other. Hereinafter, in the integrated portion of the deflection mirrors 211 and 212 and the support 213b of the mirror module 21, the rectangular part smaller in a longitudinal direction is referred to as a short portion, and the rectangular part larger in a longitudinal direction is referred to as a long portion.

The pair of deflection mirrors 211 and 212 integrated via the mirror frame 213 are placed with the long portion being under the short portion, with the central axis being aligned with the center of the circle of the circular plate 213a, and to protrude from the circular surface of the circular plate 213a in a direction perpendicular to the circular surface of the circular plate 213a. This arrangement allows the deflection mirrors 211 and 212 to rotate about the rotational shaft of the motor 23 in accordance with the motor driving. The reflective surfaces of the deflection mirrors 211 and 212 are parallel with the rotational shaft of the motor 23 irrespective of the rotational position of the motor 23.

The partition 22 is a disc-shaped member having a diameter equal to the length of the long portion of the mirror module 21. The partition 22 is divided into two semicircular portions. The two semicircular portions hold the short portion of the mirror module 21 from both sides and fixed in contact with a step formed by the long portion and the short portion of the mirror module 21.

Hereinafter, in the deflection mirrors 211 and 212, the part above the partition 22 (i.e., the part of the short portion) is referred to as an emitted light deflection section 20a, and the part below the partition 22 (i.e., the part of the long portion) is referred to as a received light deflection section 20b.

The light emitting unit 10, as shown in FIGS. 2 to 4, includes a pair of light sources 11 and 12, a pair of emitter lenses 13 and 14, and an emitted light turning mirror 15.

Figure 6:
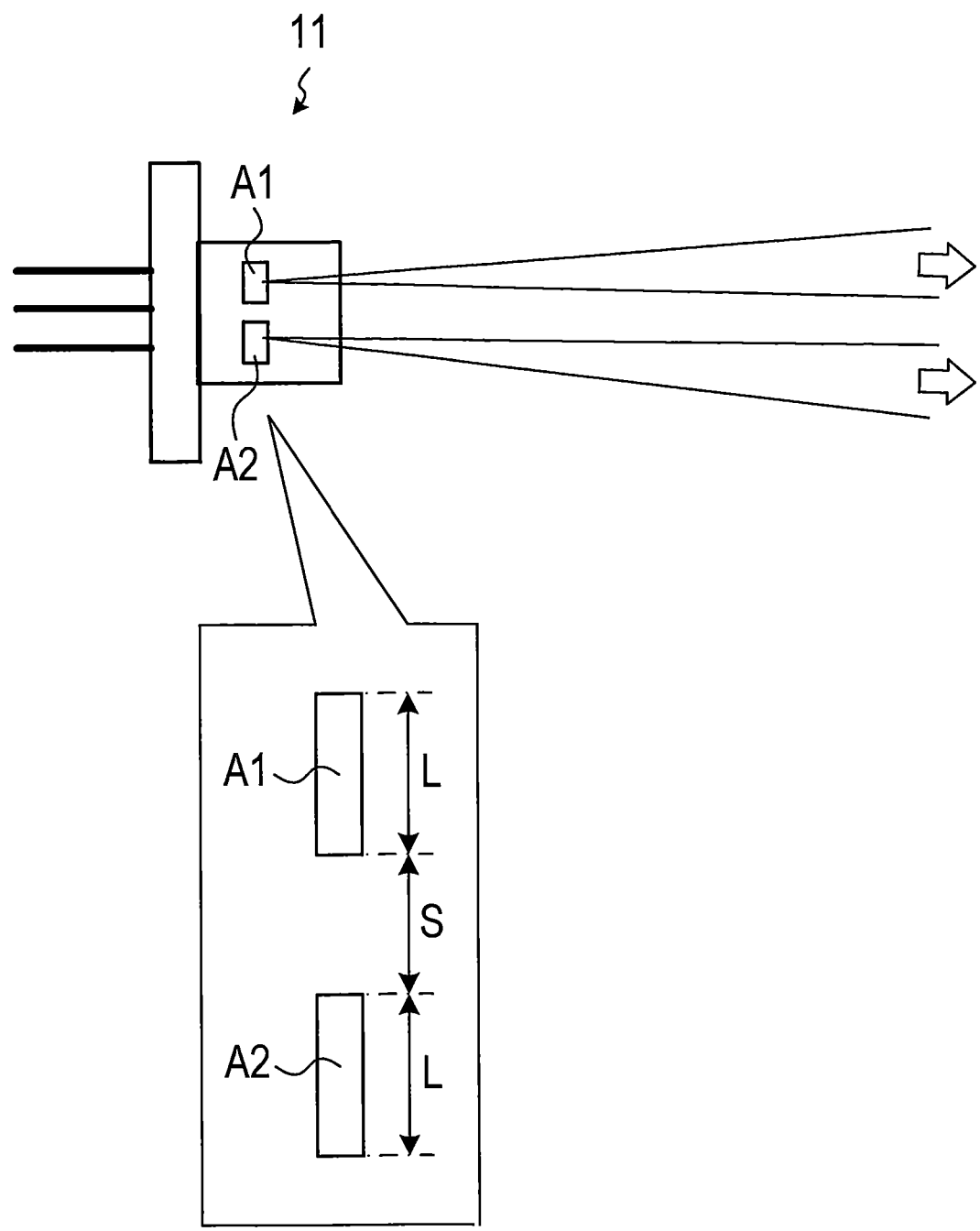
FIG. 6 shows a configuration of a light source.

The light sources 11 and 12 have the same structure, and the structure of the light source 11 will be described herein. The light source 11 is, as shown in FIG. 6, a so-called multi-stripe semiconductor laser including a plurality of light emitting areas A1 and A2. The light emitting areas A1 and A2 are formed as rectangles arranged in their longitudinal directions. The light emitting areas A1 and A2 have an area length L in the arrangement direction equal to or greater than the area interspace S between the light emitting area A1 and the light emitting area A2. The light emitting areas A1 and A2 emit light beams having optical axes parallel with each other.

Hereinafter, in the emitted light deflection section 20a, the point on which light beams are incident from the light sources 11 and 12 is referred to as a reflection point. Furthermore, the plane orthogonal to the rotation axis and including the reflection point is referred to as a reference plane.

As shown in FIGS. 2 to 4, the light source 11 is positioned to the left along the X axis away from the reflection point, with the light emitting surface facing the emitted light deflection section 20a. The light source 12 is positioned to the rear along the Z axis away from the turning point at or near the middle of the path from the reflection point to the light source 11, with the light emitting surface facing forward along the Z axis. Regarding the positions of the light sources 11 and 12 in the Y axis direction, the light source 11 is placed below the reference plane, and the light source 12 is placed above the reference plane. The light sources 11 and 12 are placed so that the light emitting areas A1 and A2 are arranged in the Y axis direction.

The emitter lens 13 is placed opposite the light emitting surface of the light source 11. Similarly, the emitter lens 14 is placed opposite the light emitting surface of the light source 12. The light sources 11 and 12 are placed near the focuses of the emitter lenses 13 and 14, respectively.

Figure 8:
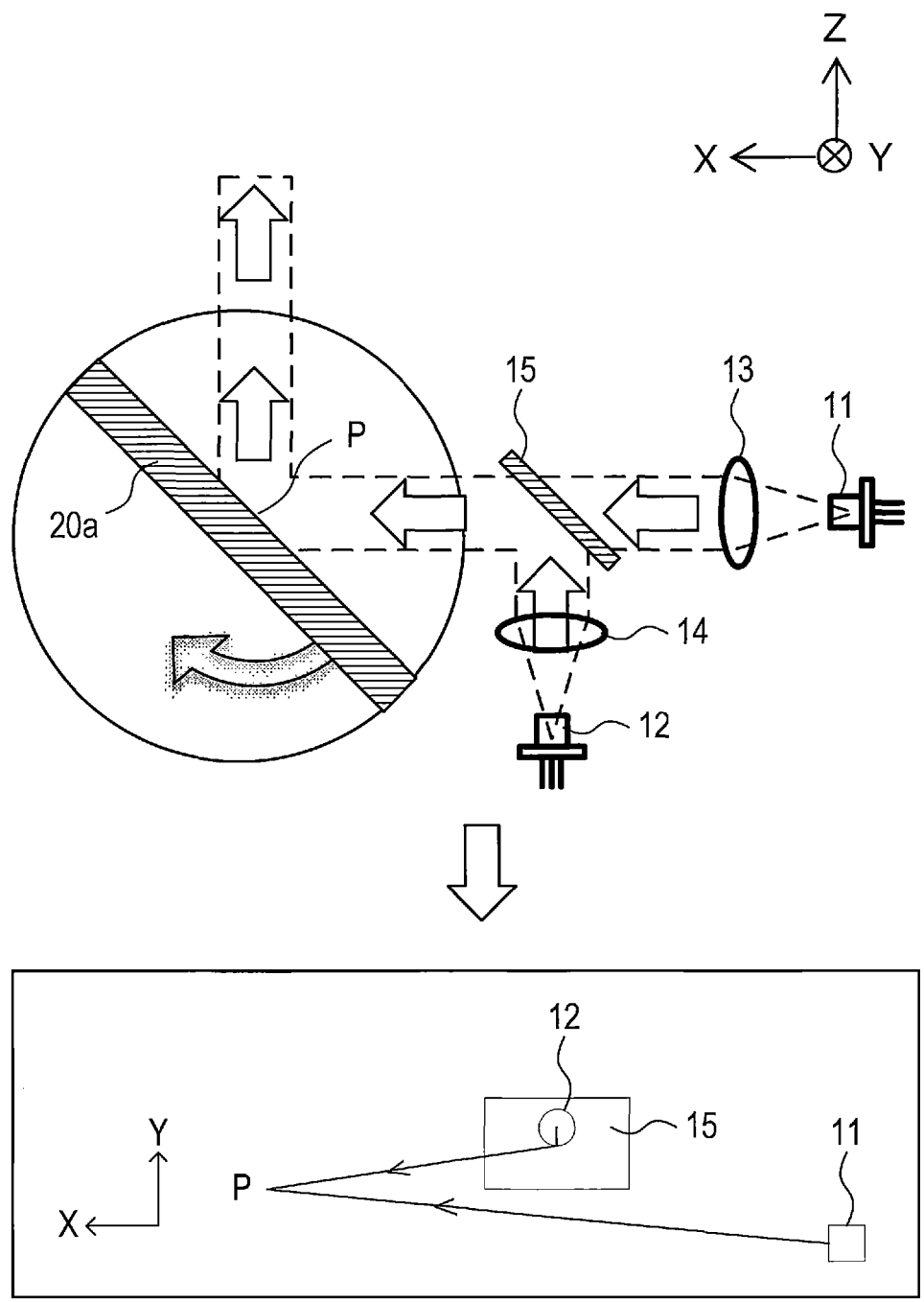
FIG. 8 shows a path of emitted light.

The emitted light turning mirror 15, which is placed at the turning point described above, reflects and guides light emitted from the light source 12 to the reflection point described above. The emitted light turning mirror 15 is, as shown in FIG. 8, placed above the path of light emitted from the light source 11 to the reflection point so as not to obstruct the path. The optical path from the light source 11 to the reflection point has the same length as the optical path from the light source 12 to the reflection point via the emitted light turning mirror 15. The light source 11 has an optical axis inclined 1 to 2 degrees upward from the reference plane, and the light source 12 has an optical axis inclined 1 to 2 degrees downward from the reference plane. In other words, the optical axes of the light sources 11 and 12 are oriented symmetrically about the reference plane. The angles are not limited to 1 to 2 degrees, but may be determined as appropriate depending on the intended light beam emission angle in the sub-scanning direction.

The light receiving unit 30, as shown in FIGS. 2 to 4, includes a light receiving element 31, a light receiving lens 32, and a received light turning mirror 33.

Figure 7:
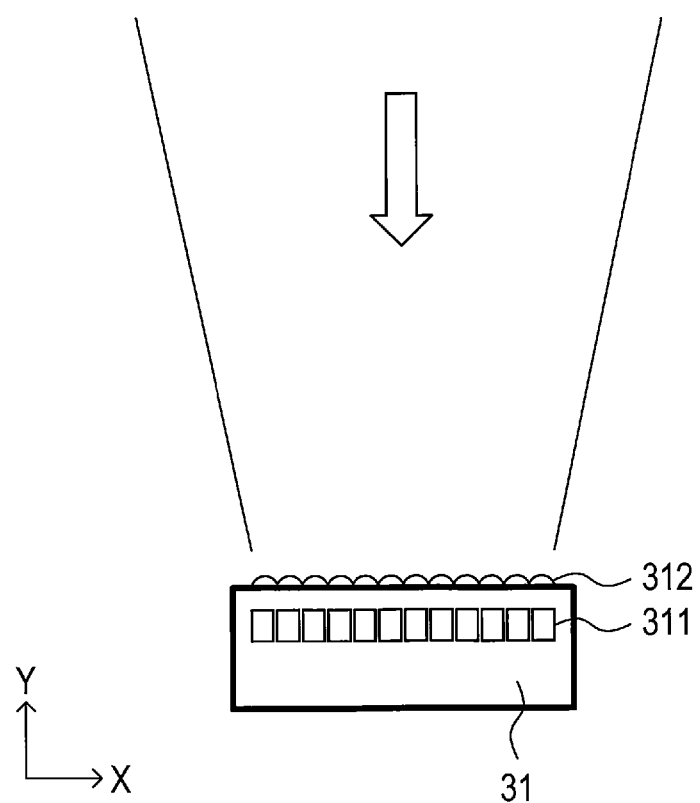
FIG. 7 shows a configuration of a light receiving element.

The light receiving element 31, as shown in FIG. 7, includes an avalanche photodiode array 311 (hereinafter, APD array 311) and a lens array 312. APD is an abbreviation for avalanche photodiode. The APD array 311 includes 12 avalanche photodiodes (hereinafter, APDs) arranged in a row. The lens array 312 includes 12 lenses facing the 12 APDs of the APD array 311 on a one-to-one basis, and narrows and guides light incident on the light receiving element 31 to each APD.

Figure 9:
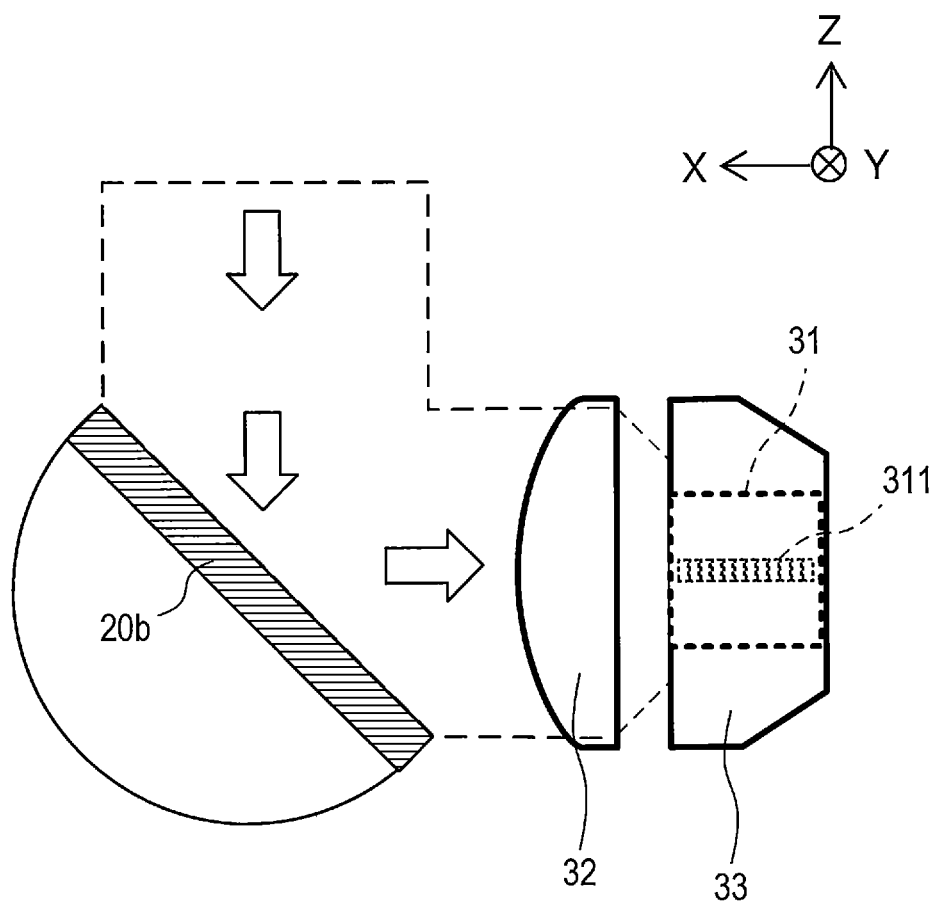
FIG. 9 shows a path of received light.

The light receiving element 31 is, as shown in FIGS. 3 and 9, placed below the received light turning mirror 33, with the light receiving surface facing upward along the Y axis and the APDs of the APD array 311 aligned with the X axis direction. In FIG. 3, a part of the frame 40 is not shown to increase the visibility of each arranged component.

The received light turning mirror 33 is positioned to the left along the X axis from the received light deflection section 20b. The received light turning mirror 33 bends the optical path substantially 90 degrees downward in the Y axis direction so that light incident from the received light deflection section 20b via the light receiving lens 32 reaches the light receiving element 31.

The light receiving lens 32 is placed between the received light deflection section 20b and the received light turning mirror 33. The light receiving lens 32 narrows the light beam incident on the light receiving element 31 so that its width in the Z axis direction becomes substantially equal to the APD element width.

The frame 40 is a member that integrates each component included in the light emitting unit 10, the scanning unit 20, and the light receiving unit 30. That is, the components included in the light emitting unit 10, the scanning unit 20, and the light receiving unit 30 are installed in the housing 100 with the positional relationship between the components established.

The frame 40, as shown in FIGS. 2 to 4, includes a frame bottom 41, a frame side 42, a frame back 43, and a partition 44.

The frame bottom 41 is underlain by a light receiver substrate 51 to which the light receiving element 31 is fixed and a motor substrate 52 to which the scanning unit 20 is fixed. Thus, the frame bottom 41 has holes at a site through which light passes from the received light turning mirror 33 to the light receiving element 31, and a site at which the motor 23 of the scanning unit 20 is placed.

The frame side 42 has a front surface, which is the surface facing the scanning unit 20, and a cylindrical holder 421 is installed on the front surface. The holder 421 has the emitter lens 13 fitted in the opening in its front end (i.e., the right end in the X axis direction). The back surface of the frame side 42 is fitted with a light emitter substrate 53 on which the light source 11 is installed. When the light emitter substrate 53 is attached to the frame side 42, the light source 11 is placed at the back end of the holder 421 (i.e., the left end in the X axis direction).

In the same manner as for the frame side 42, a holder 431 is installed on the frame back 43. The holder 431 has the emitter lens 14 fitted in its front end (i.e., the forward end in the Z axis direction). The back surface of the frame back 43 is fitted with a light emitter substrate 54 on which the light source 12 is installed. When the light emitter substrate 54 is attached to the frame back 43, the light source 12 is placed at the back end of the holder 431 (i.e., the rearward end in the Z axis direction).

The partition 44 is positioned in a manner to define a space in which the components of the light emitting unit 10 are placed and a space in which components of the light receiving unit 30 are placed. The partition 44 is fitted with the emitted light turning mirror 15, the received light turning mirror 33, and the light receiving lens 32.

The light receiver substrate 51 and the light emitter substrates 53 and 54 are each screwed to the frame 40. The lidar device 1 allows three-dimensional fine adjustments to the installation position and the angle of each of the light receiving element 31 and the light sources 11 and 12 by modifying the installation positions and the angles of the light receiver substrate 51 and the light emitter substrates 53 and 54. In the present embodiment, the holders 421 and 431 are integrated with the frame side 42 and the frame back 43, respectively. However, the holders 421 and 431 may be integrated with the light emitter substrate 53 and the light emitter substrate 54.

A controller (not shown) is fitted to, for example, the housing 100. The controller controls the timing of light emission from the light sources 11 and 12 in synchronization with the rotation of the mirror module 21 of the scanning unit 20. More specifically, the controller controls the light beam from the light source 11 to be incident on the deflection mirror 211 and the light beam from the light source 12 to be incident on the deflection mirror 212.

As shown in FIG. 8, the light emitted from the light source 11 is incident on the reflection point P on the emitted light deflection section 20a through the emitter lens 13. The light emitted from the light source 12 passes through the emitter lens 14. After that, its traveling direction is deflected substantially 90 degrees by the emitted light turning mirror 15. The light is then incident on the reflection point P on the emitted light deflection section 20a. It is noted that the light source 11 and the light source 12 use different surfaces of the emitted light deflection section 20a. The light incident on the reflection point P is directed in accordance with the rotational position of the mirror module 21.

As shown in FIG. 9, the light reflected from a subject positioned in the predetermined direction in accordance with the rotational position of the mirror module 21 (i.e., the direction in which light is emitted from the emitted light deflection section 20a) is reflected by the received light deflection section 20b and detected in the light receiving element 31 through the light receiving lens 32 and the received light turning mirror 33. Note that subjects are various targets to be detected by the lidar device 1.

More specifically, in the lidar device 1, horizontal scanning in the X axis direction (hereinafter, main scanning) is mechanically achieved by the rotation of the mirror module 21. Additionally, vertical scanning in the Y axis direction (hereinafter, sub-scanning) is electronically achieved by the light sources 11 and 12 for outputting four beams that are adjacent to each other in the vertical direction and the APD array 311 for receiving the four beams.

Figure 10:
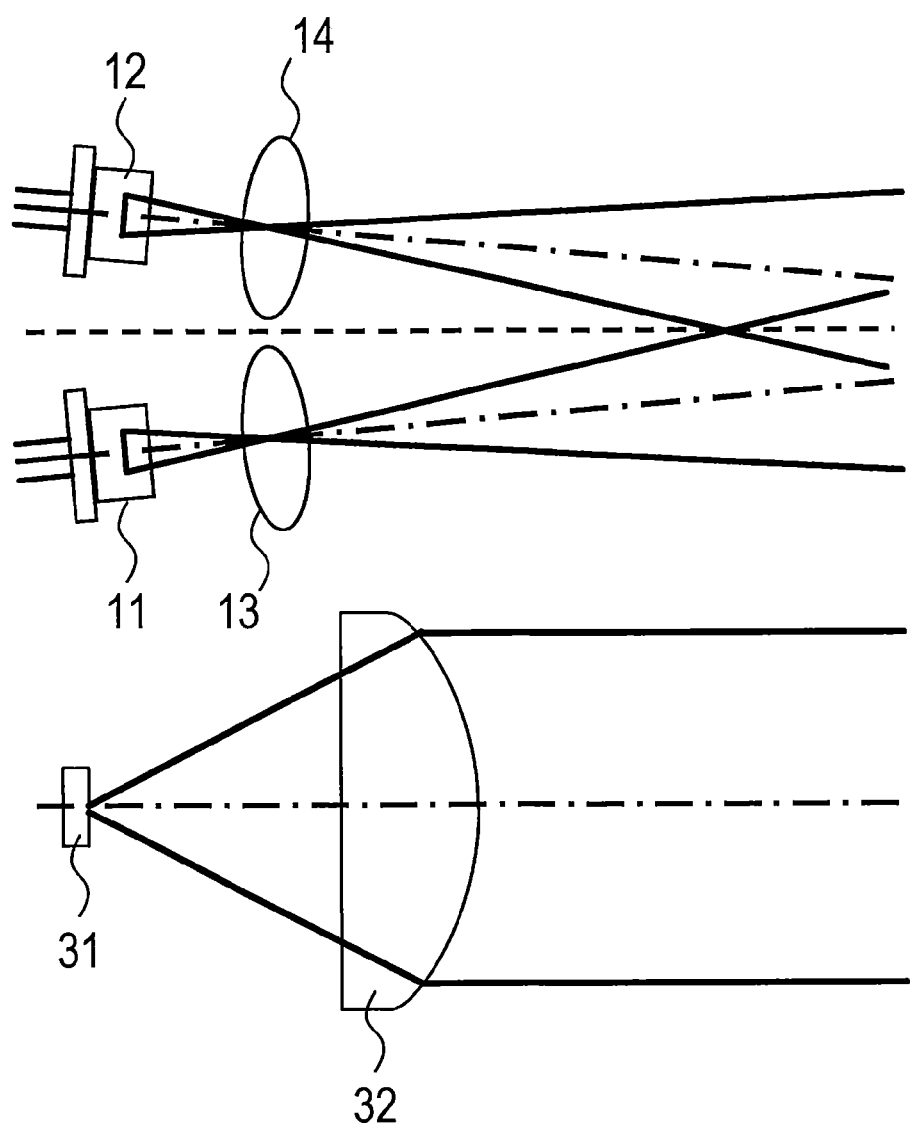
FIG. 10 illustrates positional adjustment of light sources and the light receiving element.

As shown in FIGS. 8 to 10, the light sources 11 and 12 are placed so that their optical paths to the reflection point P on the emitted light deflection section 20a have an equal length, and their optical axes intersect at reflection point P. The light receiving element 31 is placed near the focus of the light receiving lens 32.

Figure 11:
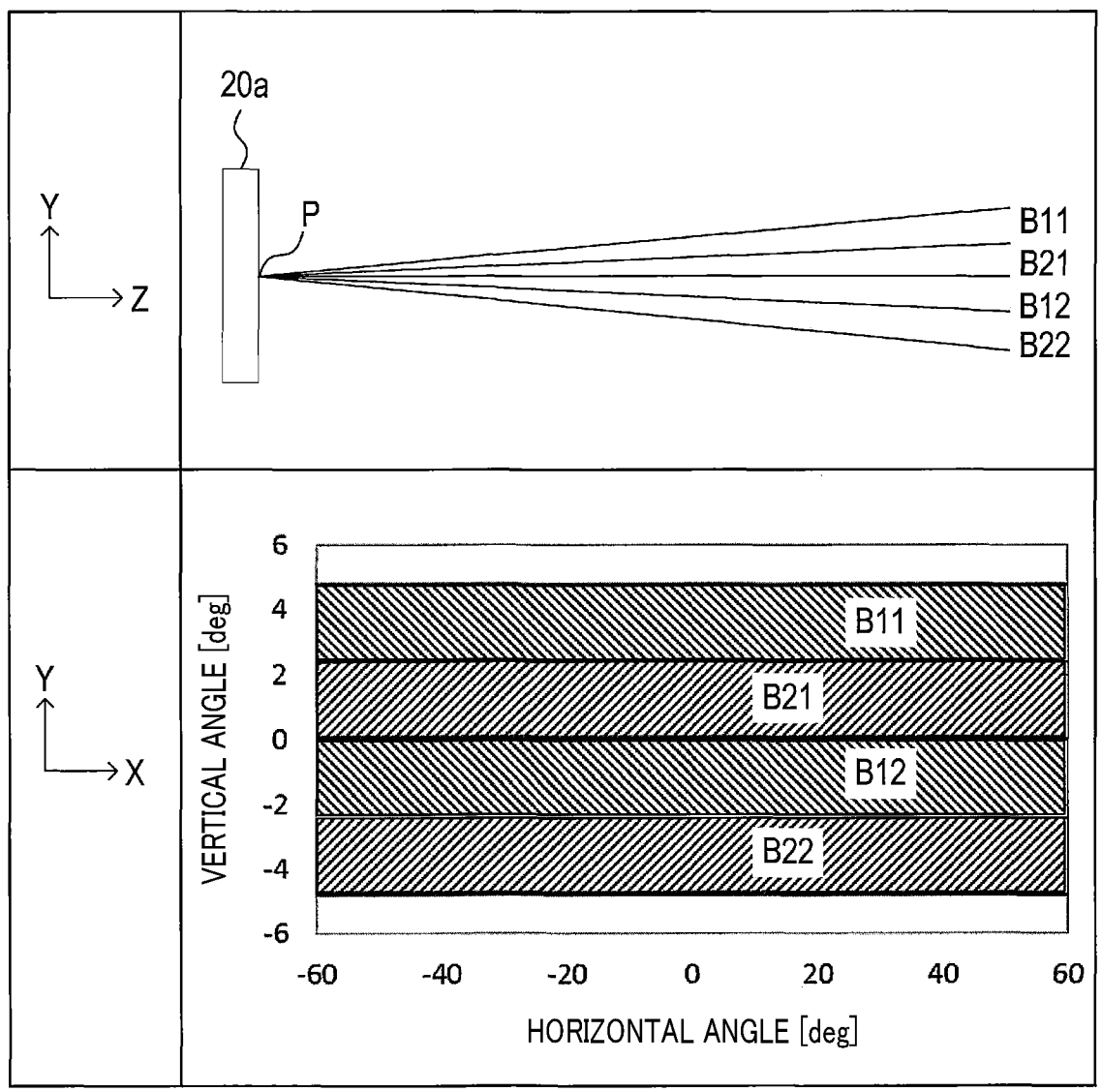
FIG. 11 shows an illumination range of light beams emitted from a deflection mirror.
Figure 12:
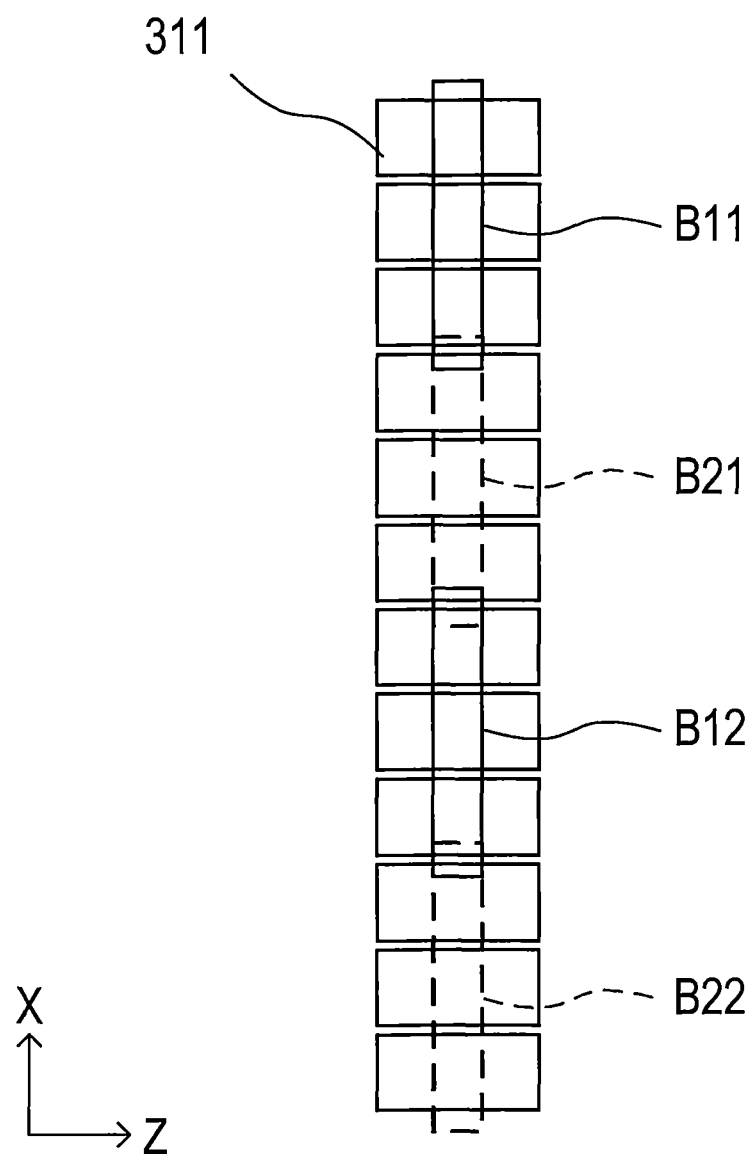
FIG. 12 shows a correspondence between light emitting areas of the light sources and light receiving area of the light receiving element.

Light beams from the light emitting areas A1 and A2 of the light source 11 are denoted by B11 and B12, and light beams from the light emitting areas A1 and A2 of the light source 12 are denoted by B21 and B22. As shown in FIG. 11, the light beams emitted from the reflection point P on the emitted light deflection section 20a are the light beam B11, the light beam B21, the light beam B12, and the light beam B22 in this order from top to bottom along the Y axis. Additionally, the positions of the light sources 11 and 12 are finely adjusted so as not to form a gap between the light beams B11, B21, B12, and B22. As shown in FIG. 12, the positions of the light sources 11 and 12 are also finely adjusted so that the APD array 311 of the light receiving element 31 receives reflected light (hereinafter, returning light beams) from the subject irradiated with the light beams B11, B21, B12, and B22, and the returning light beams are applied to the center in the Z axis direction of each APD with each beam hitting three different elements.

The reflective surface of the emitted light deflection section 20a is parallel with the rotation axis of the mirror module 21, and thus the inclination angle of the reflective surface in vertical plane including the path of light incident on the emitted light deflection section 20a is unaffected by the rotational position of the mirror module 21. The vertical planes refer to planes along the Y axis. More specifically, as indicated in the graph of FIG. 11, irrespective of the emission angle in the X axis direction (i.e., the horizontal angle), which is the main scanning direction of the light emitted from the emitted light deflection section 20a, the emission angle in the Y axis direction (i.e., the vertical angle), which is the sub-scanning direction, is constant. Thus, the light beams are applied to a two-dimensionally defined scan range entirely.

Figure 13:
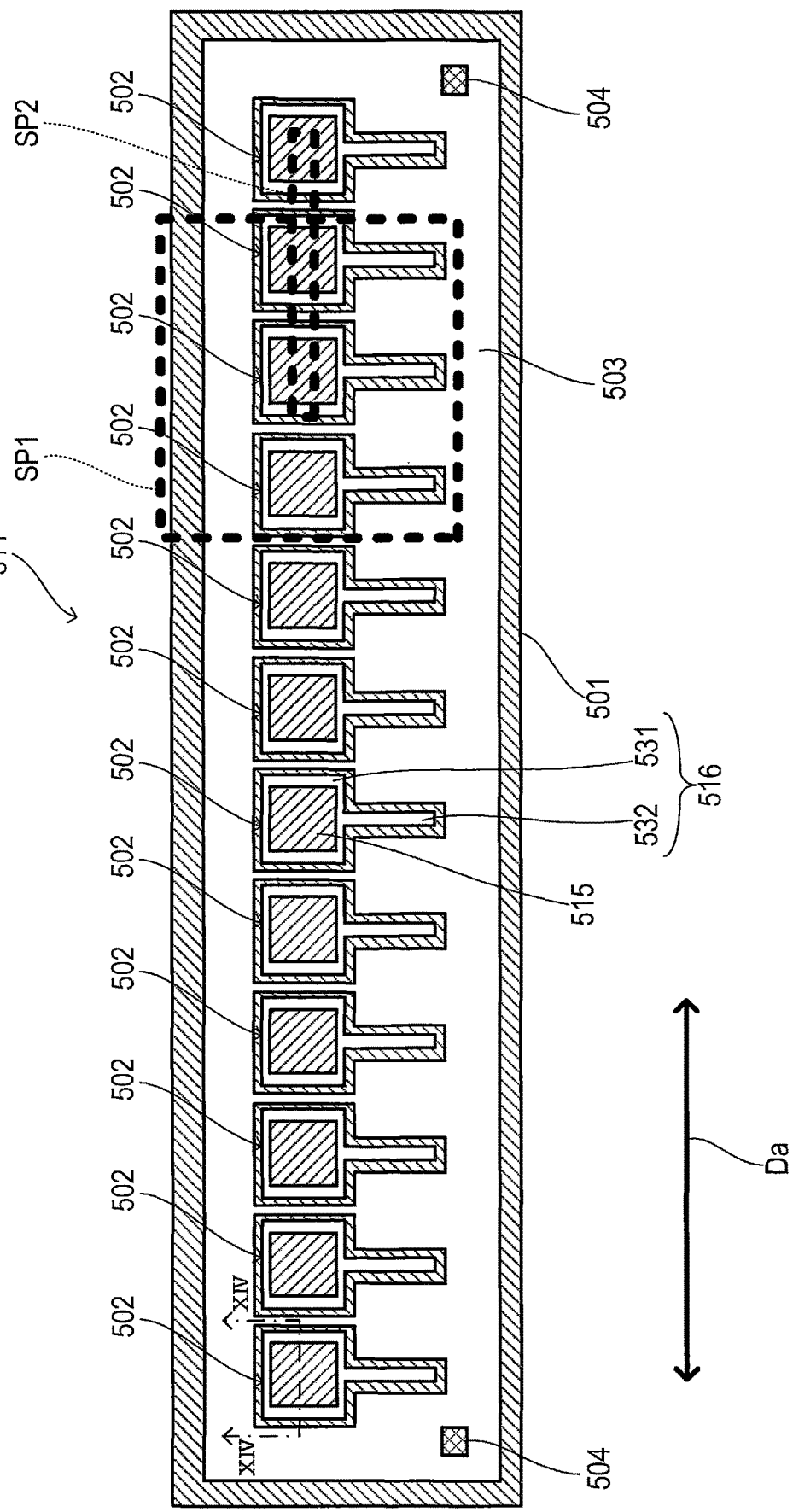
FIG. 13 is a plan view of an APD array according to a first embodiment.

The APD array 311, as shown in FIG. 13, is formed by arranging 12 APDs 502 in a row on the front surface of a substrate 501 of a p-type semiconductor (in the present embodiment, silicon). However, the substrate 501 may be formed of an i-type semiconductor.

The APD array 311 includes the 12 APDs 502, one unnecessary-carrier discharge electrode 503, and two bonding pads 504 on the front surface of the substrate 501.

Figure 14:
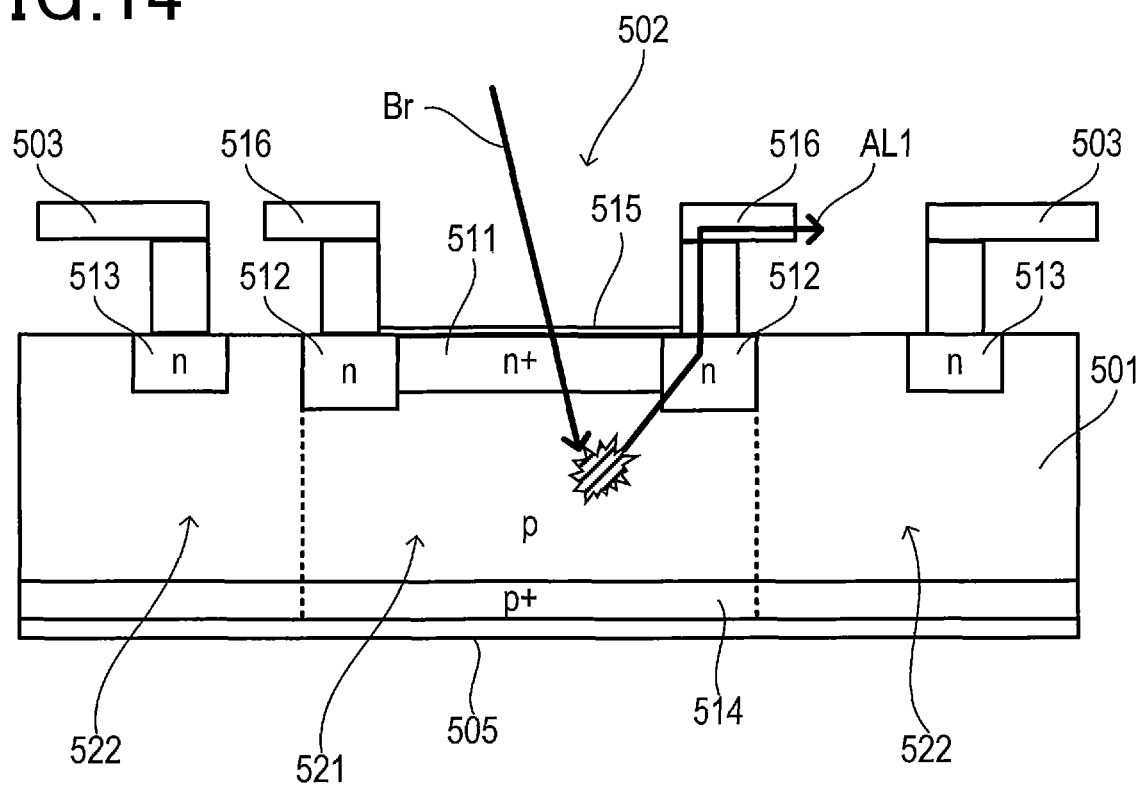
FIG. 14 is a cross-sectional view of an APD.

An APD 502, as shown in FIG. 14, includes an n+ region 511, an n region 512, an n region 513, a p+ region 514, an antireflection film 515, and a signal extraction electrode 516.

The n+ region 511 is an n-type region formed in the front surface of the substrate 501. The n+ region 511 contains a higher concentration of n-type impurities than the n regions 512 and 513.

The n region 512 is an n-type region formed in the front surface of the substrate 501, and around and in contact with the n+ region 511.

The n region 513 is an n-type region formed in the front surface of the substrate 501 and around, but not in contact with, the n region 512.

The p+ region 514 is a p-type region formed in the back surface of the substrate 501. The p+ region 514 contains a higher concentration of p-type impurities than the substrate 501.

The antireflection film 515 is a film formed from, for example, silicon nitride and placed on the n+ region 511. The antireflection film 515 reduces the surface reflection of light incident on the antireflection film 515.

The signal extraction electrode 516 is an electrode formed from, for example, Al or Cu, placed on the n region 512, and electrically connected to the n region 512. The signal extraction electrode 516 receives a high voltage (e.g., 300 V).

In the substrate 501, the n+ region 511, the n region 512, and the region under the n+ region 511 and the n region 512 are hereinafter referred to as a pixel region 521. In the substrate 501, the region other than the pixel region 521 is hereinafter referred to as a pixel neighboring region 522.

The unnecessary-carrier discharge electrode 503 is an electrode formed from, for example, Al or Cu, placed on the n region 513, and electrically connected to the n region 513.

The APD array 311 also includes, on the back surface of the substrate 501, a back-side electrode 505 formed from, for example, AlSiCu.

As shown in FIG. 13, the antireflection film 515 is rectangular. The signal extraction electrode 516 includes a frame portion 531 and a linear portion 532. The frame portion 531 is shaped as a rectangular frame surrounding the antireflection film 515. The linear portion 532 is shaped as a straight line extending from the frame portion 531 in a direction perpendicular to the arrangement direction Da of the 12 APDs 502.

The unnecessary-carrier discharge electrode 503 is formed around, but not in contact with, the 12 signal extraction electrodes 516 arranged in a row. The unnecessary-carrier discharge electrode 503 is also formed between every two adjacent frame portions 531 to surround each of the 12 signal extraction electrodes 516.

The bonding pads 504 are formed from, for example, Al or Cu. The two bonding pads 504 are positioned on the rectangular substrate 501 at one end and the other end in the arrangement direction Da of the 12 APDs 502. The two bonding pads 504 are electrically connected to the unnecessary-carrier discharge electrode 503.

Figure 15:
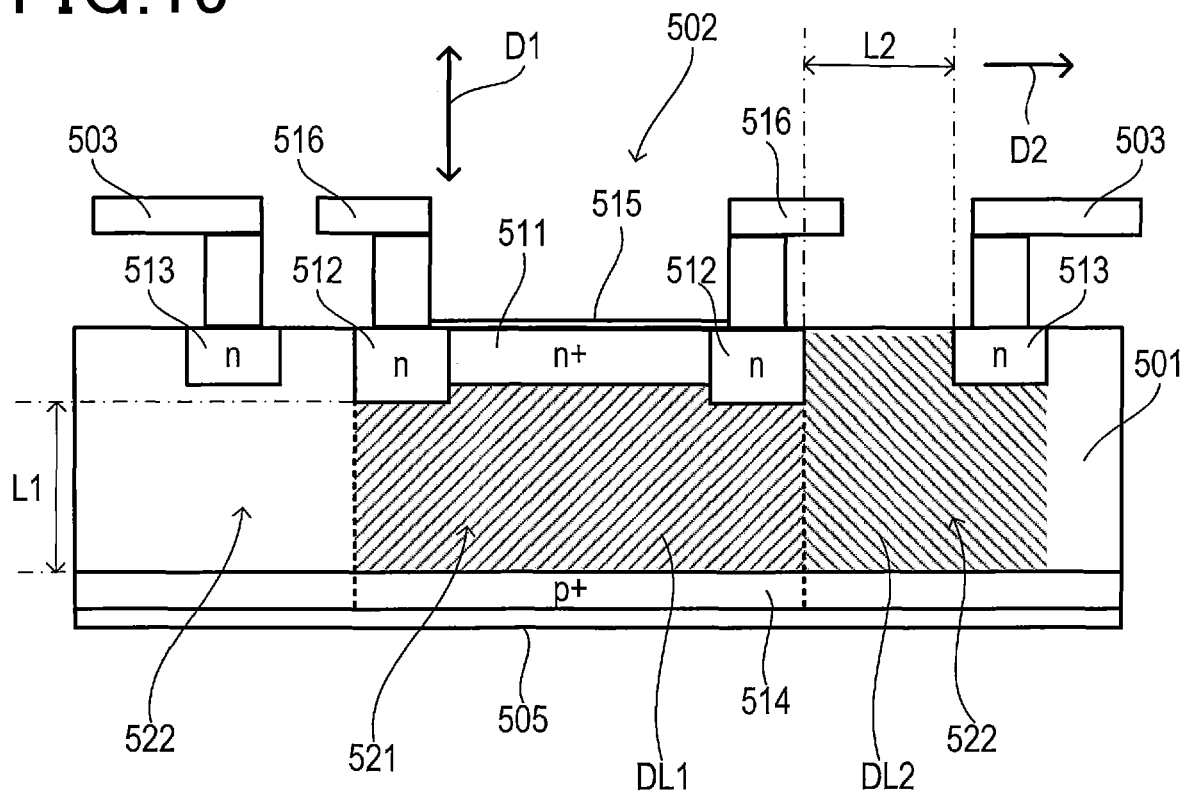
FIG. 15 is a cross-sectional view of an APD, showing a depletion layer.

As shown in FIG. 15, the pixel region 521 includes a depletion layer DL1 immediately below the n+ region 511 and the n region 512. In addition, the pixel neighboring region 522 includes a depletion layer DL2 immediately below the region between the n region 512 and the n region 513.

The depletion layer DL1 has a length L1 along a thickness direction D1 of the substrate 501, and the depletion layer DL2 has a length L2 along a direction D2 from the n region 512 to the n region 513, with the length L1 being smaller than the length L2. The depletion layer DL1 has an electric field intensity in the thickness direction D1 greater than the electric field intensity of the depletion layer DL2 in the direction D2.

For an APD 502 having the structure described above, as shown in FIG. 14, when a returning light beam Br passes through the antireflection film 515 and enters the pixel region 521, an electron-hole pair is generated in the pixel region 521. Then, as indicated by an arrow AL1, the electron of the electron-hole pair generated in the pixel region 521 is absorbed by the n region 512 and then discharged through the signal extraction electrode 516.

Figure 16:
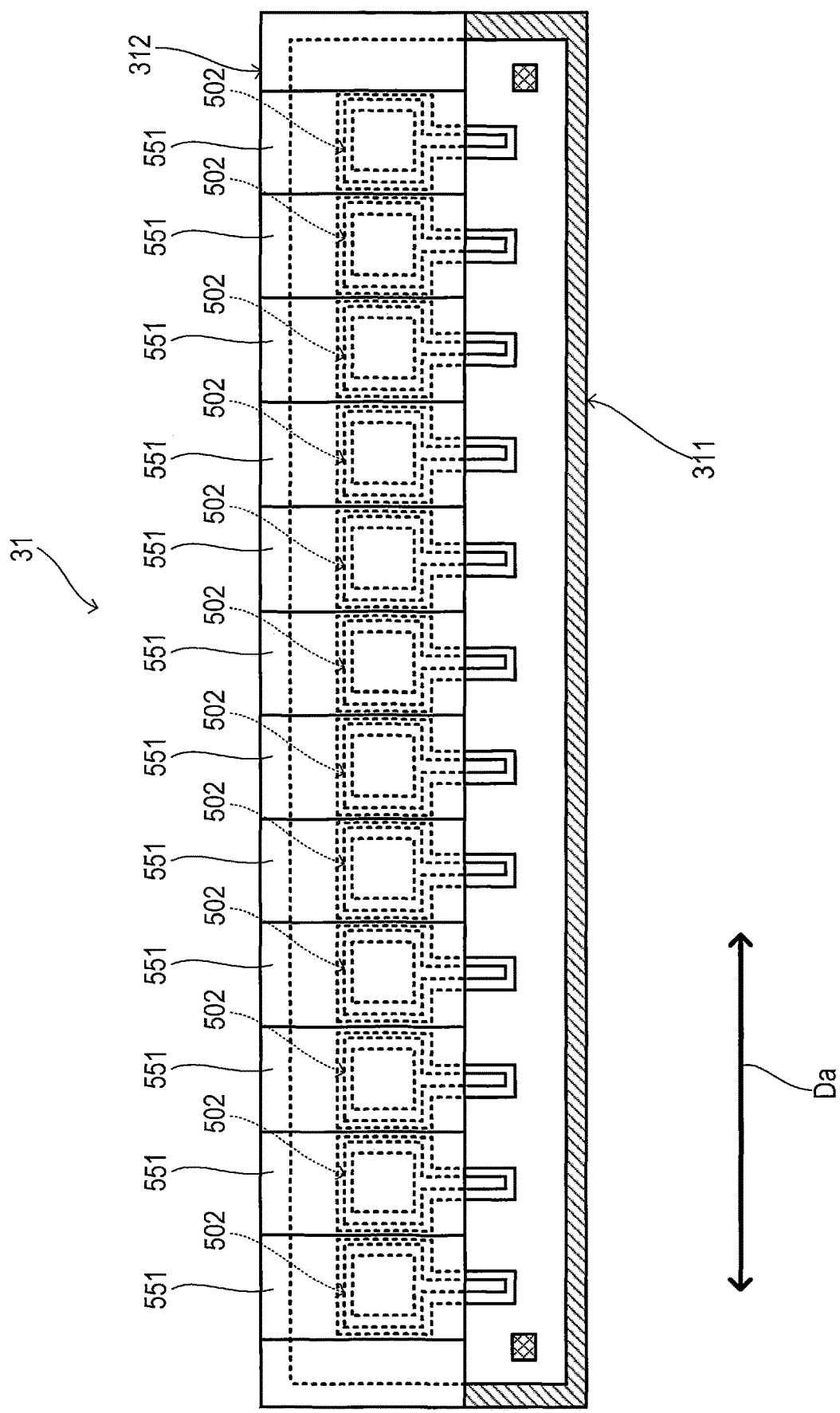
FIG. 16 is a plan view of a light receiving element according to the first embodiment.
Figure 17:
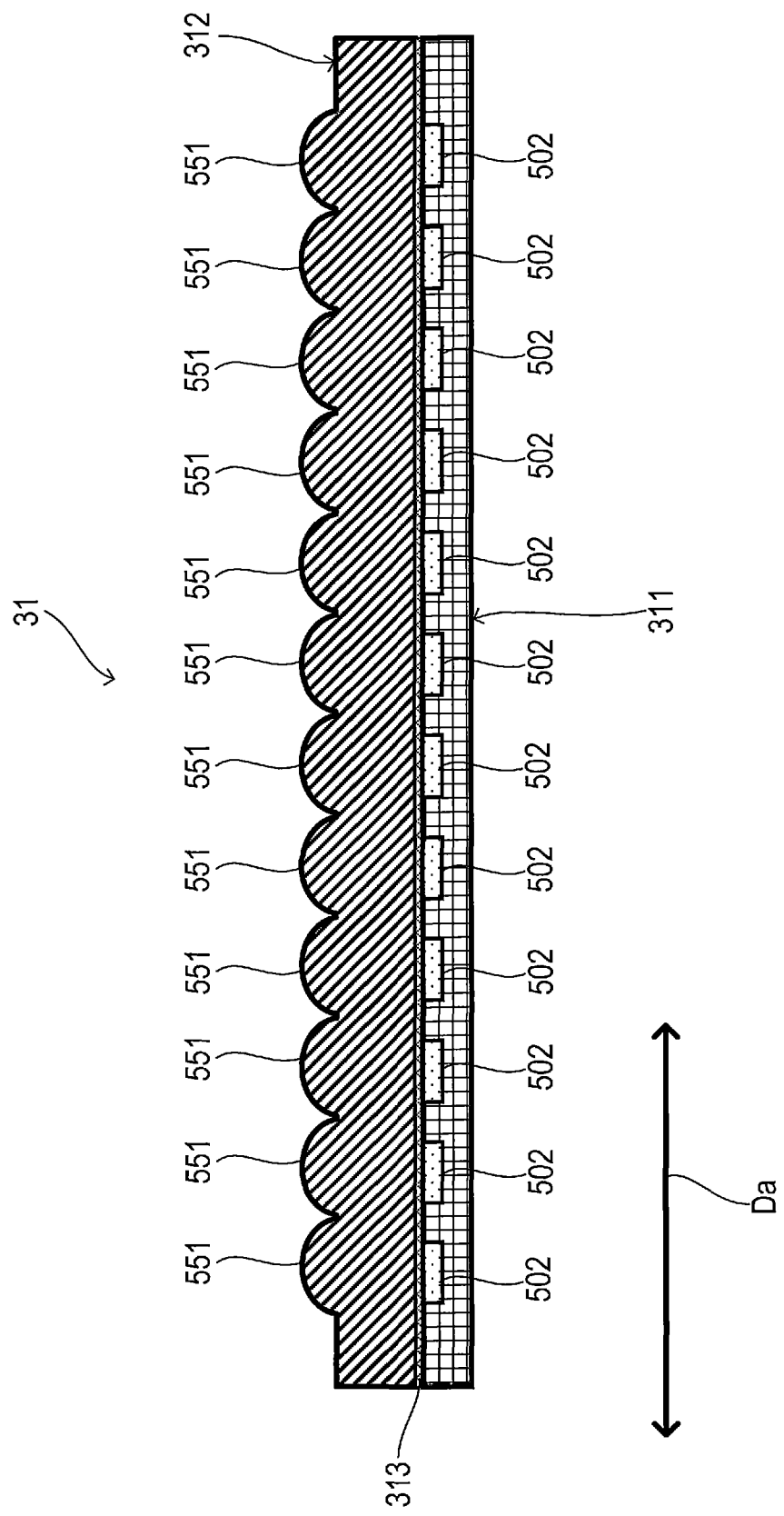
FIG. 17 is a cross-sectional view of the light receiving element according to the first embodiment.

The lens array 312 is, as shown in FIGS. 16 and 17, formed by arranging 12 convex lenses 551 in a row in the arrangement direction Da of the APDs 502. The convex lenses 551 are formed from, for example, glass or silicone resin. As shown in FIG. 17, the lens array 312 is fixed to the APD array 311 via an adhesive layer 313 to cover the APDs 502. The adhesive layer 313 is formed from a material that cures when exposed to ultraviolet radiation. The adhesive layer 313 is also formed from a material having substantially the same transmittance as the transmittance of the convex lenses 551 and the antireflection film 515. As shown in FIG. 16, the 12 convex lenses 551 are placed opposite the antireflection films 515 of the 12 APDs 502. Each of the 12 convex lenses 551 narrows light incident on the convex lens 551 and guides the light to the corresponding APD 502.

The APD array 311 having the structure described above includes the 12 pixel regions 521, the n regions 512, the signal extraction electrodes 516, the pixel neighboring regions 522, the n regions 513, and the unnecessary-carrier discharge electrode 503.

The pixel regions 521 are formed in the substrate 501 and internally generate electrons and holes in accordance with the incident light. The n regions 512 are formed in the pixel regions 521 and absorb the electrons generated in the pixel regions 521 (hereinafter, first discharge carriers). The signal extraction electrodes 516 are formed on the substrate 501 and discharge, from the n regions 512, the first discharge carriers absorbed in the n regions 512.

The pixel neighboring regions 522 are formed so as to be adjacent to the pixel regions 521 in the substrate 501 and internally generate electrons and holes in accordance with the incident light. The n regions 513 are formed in the pixel neighboring regions 522 and absorb the electrons generated in the pixel neighboring regions 522 (hereinafter, second discharge carriers). The unnecessary-carrier discharge electrode 503 is formed on the substrate 501 and allows the second discharge carriers absorbed in the n regions 513 to be discharged from the n regions 513.

In this manner, the APD array 311 allows the signal extraction electrodes 516 to discharge carriers generated in the pixel regions 521 by light entry into the pixel regions 521 (hereinafter, necessary carriers), and the unnecessary-carrier discharge electrode 503 to discharge carriers generated in the pixel neighboring regions 522 by light entry into the pixel neighboring regions 522 (hereinafter, unnecessary carriers). Thus, the APD array 311 reduces the discharge of unnecessary carriers through the signal extraction electrodes 516. More specifically, the APD array 311 reduces the inclusion of unnecessary-carrier-caused signals in signals output through the signal extraction electrodes 516.

If a pixel region 521 and a pixel neighboring region 522 receive light at the same time, the necessary carrier and the unnecessary carrier will reach the signal extraction electrode 516 at different times. Thus, the inclusion of unnecessary-carrier-caused signals in signals output through the signal extraction electrode 516 would reduce the accuracy in distance measurement. In the lidar device 1, as shown in FIG. 13, when light reflected from an object near to the lidar device 1 and received by the APD array 311 is called reflected light SP1, and light reflected from an object far from the lidar device 1 and received by the APD array 311 is called reflected light SP2, the reflected light SP1 has a spot size greater than the spot size of the reflected light SP2. For this reason, in the APD array 311, reflected light received from an object near to the APD array 311 would tend to enter a pixel neighboring region 522, generating an unnecessary carrier.

However, even when receiving light reflected from an object near to the lidar device 1, the APD array 311 reduces the inclusion of unnecessary-carrier-caused signals in signals output through the signal extraction electrodes 516 as described above. The APD array 311 thus improves the measurement accuracy of the lidar device 1.

The substrate 501 is p-type. The n region 512 and the n region 513 in the front surface of the substrate 501 are n-type, which is a conductivity type different from the p-type. The length L1 of the depletion layer DL1 in the pixel region 521 along the thickness direction D1 of the substrate 501 is smaller than the length L2 of the depletion layer DL2 between the n region 512 and the n region 513 along the direction D2 from the n region 512 to the n region 513. The dimensions can prevent electrons generated in the pixel region 521 from drifting toward the n region 513. As a result, the APD array 311 further reduces the inclusion of unnecessary-carrier-caused signals in signals output through the signal extraction electrode 516, thus further improving the measurement accuracy of the lidar device 1.

The electric field intensity of the depletion layer DL1 in the thickness direction D1 is greater than the electric field intensity of the depletion layer DL2 in the direction D2. This can prevent electrons generated in the pixel region 521 from drifting toward the n region 513. As a result, the APD array 311 further reduces the inclusion of unnecessary-carrier-caused signals in signals output through the signal extraction electrode 516, thus further improving the measurement accuracy of the lidar device 1.

The APD array 311 includes the convex lenses 551 placed opposite the pixel regions 521 over the substrate 501. This arrangement enables light incident on the convex lenses 551 to be narrowed and guided to the pixel regions 521, so that the APD array 311 can have a higher effective aperture ratio to incident light and also reduce light incident on the pixel neighboring regions 522.

The substrate 501 is shaped as a rectangular plate, and the APD array 311 includes the bonding pads 504. The bonding pads 504 are positioned on the substrate 501 at both longitudinal ends of the substrate 501 and electrically connected to the unnecessary-carrier discharge electrode 503. As a result, the APD array 311 does not easily cause the unnecessary-carrier discharge electrode 503 to have a potential difference along the longitudinal direction of the substrate 501.

The lidar device 1 includes the light emitting unit 10, the light receiving unit 30, and the scanning unit 20.

The light emitting unit 10 includes the light sources 11 and 12 that output light. The light receiving unit 30 includes the APD array 311 that receives light coming in a predetermined direction. The scanning unit 20 includes the reflective surface that reflects light incident from the light emitting unit 10. By rotating the reflective surface about the predefined rotation axis, the scanning unit 20 changes the emission direction of the light incident from the light emitting unit 10 along the main scanning direction orthogonal to the rotation axis direction, and reflects and guides the light reflected from a subject within the scan range to the light receiving unit 30.

The lidar device 1, which includes the APD array 311, achieves the same advantageous effects as the APD array 311.

In the embodiment described above, the APD array 311 corresponds to a photodetection element, the substrate 501 corresponds to a semiconductor substrate, the n region 512 corresponds to a first absorption region, the signal extraction electrode 516 corresponds to a first discharge electrode, the n region 513 corresponds to a second absorption region, and the unnecessary-carrier discharge electrode 503 corresponds to a second discharge electrode. Although the APDs described above are produced by n-doping a p substrate, an n substrate may be p-doped. Although described based on the cross section of reach-through devices, which may have a thicker depletion layer, the above embodiment may be applied to reverse-type devices, which cannot have a thick depletion layer compared with reach-through devices. The above embodiment may be applied not only to APDs, but also to photodiodes with no multiplication effect or single-photon avalanche diodes with quite a high multiplication factor.

Second Embodiment

A second embodiment of the present disclosure will now be described with reference to the drawings. In the second embodiment, differences from the first embodiment will be described. Common components will be given the same reference numerals.

A lidar device 1 according to the second embodiment is different from the lidar device according to the first embodiment in that an APD array 311 includes a different number of bonding pads 504.

Figure 18:
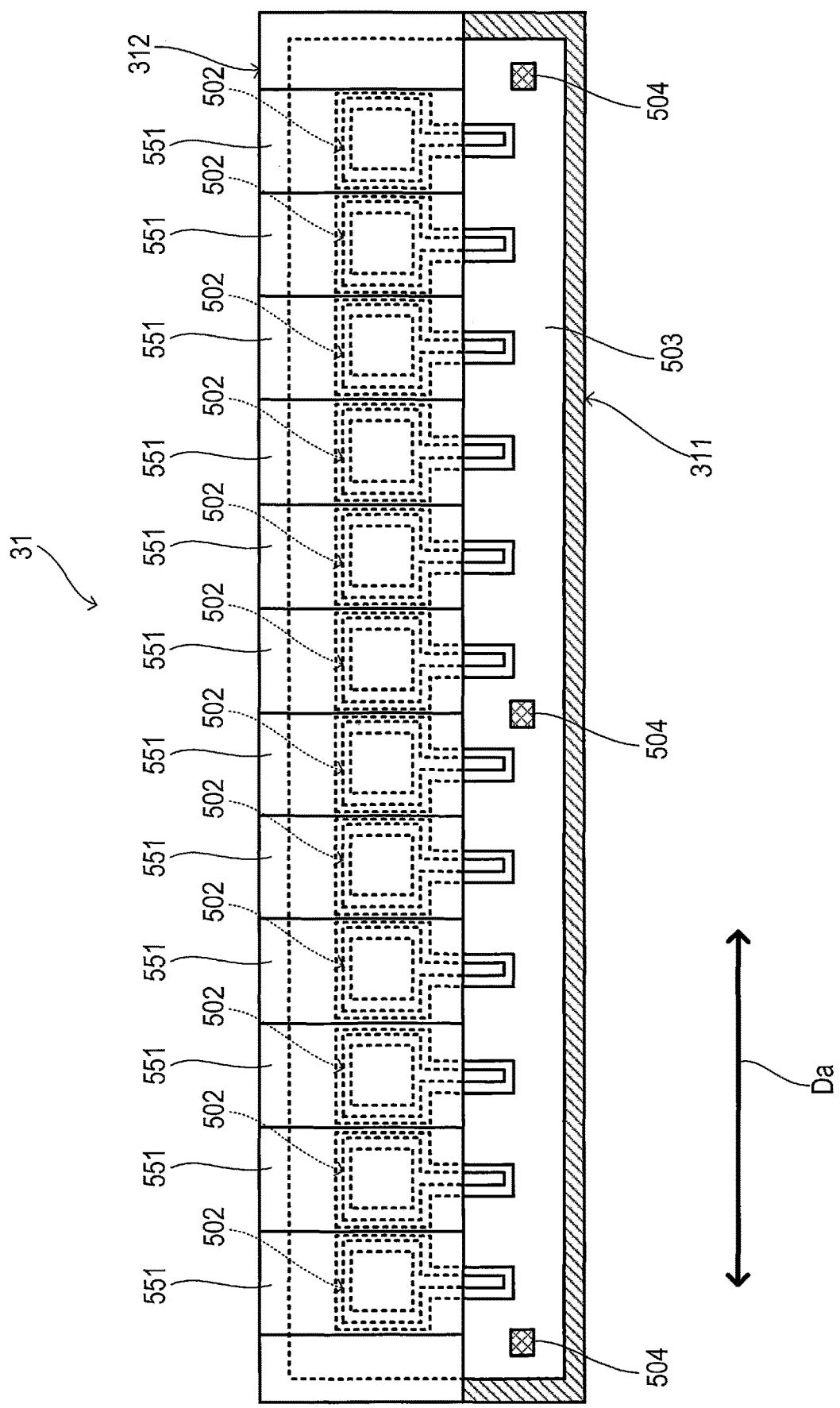
FIG. 18 is a plan view of an APD array according to a second embodiment.

The APD array 311 according to the second embodiment, as shown in FIG. 18, includes three bonding pads 504. The three bonding pads 504 are positioned on a rectangular substrate 501: one at one end in the arrangement direction Da, another at the other end, and the other at the center.

The APD array 311 has higher performance of discharging unnecessary carriers owing to the additional bonding pad 504.

Third Embodiment

A third embodiment of the present disclosure will now be described with reference to the drawings. In the third embodiment, differences from the first embodiment will be described. Common components will be given the same reference numerals.

A lidar device 1 according to the third embodiment is different from the lidar device according to the first embodiment in that an APD array 311 includes no lens array 312 and a different number of bonding pads 504.

Figure 19:
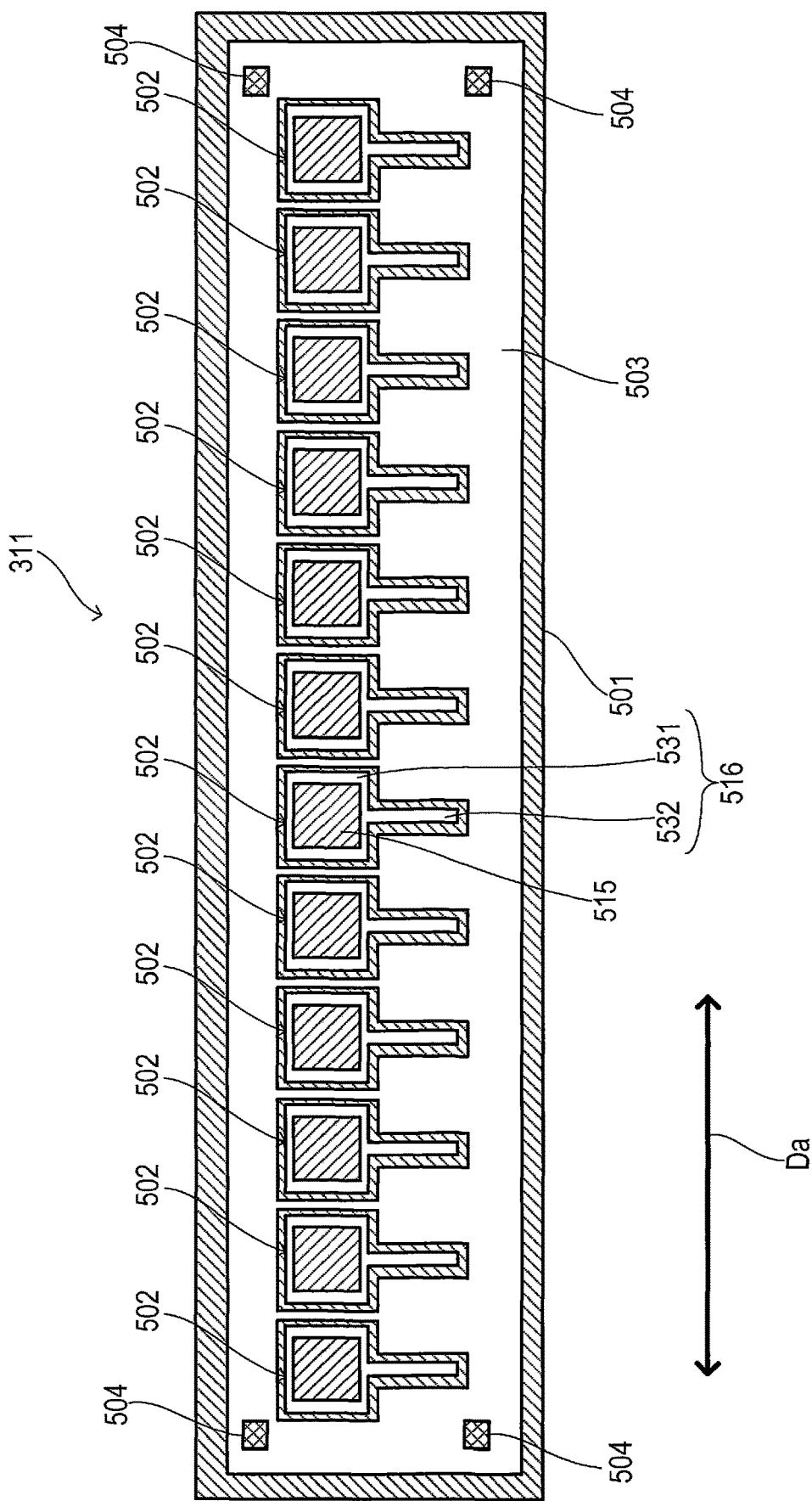
FIG. 19 is a plan view of an APD array according to a third embodiment.

The APD array 311 according to the third embodiment, as shown in FIG. 19, includes four bonding pads 504. The four bonding pads 504 are respectively positioned at the four corners of a rectangular substrate 501.

The APD array 311 has higher performance of discharging unnecessary carriers owing to the additional bonding pads 504.

Fourth Embodiment

A fourth embodiment of the present disclosure will now be described with reference to the drawings. In the fourth embodiment, differences from the first embodiment will be described. Common components will be given the same reference numerals.

Figure 20:
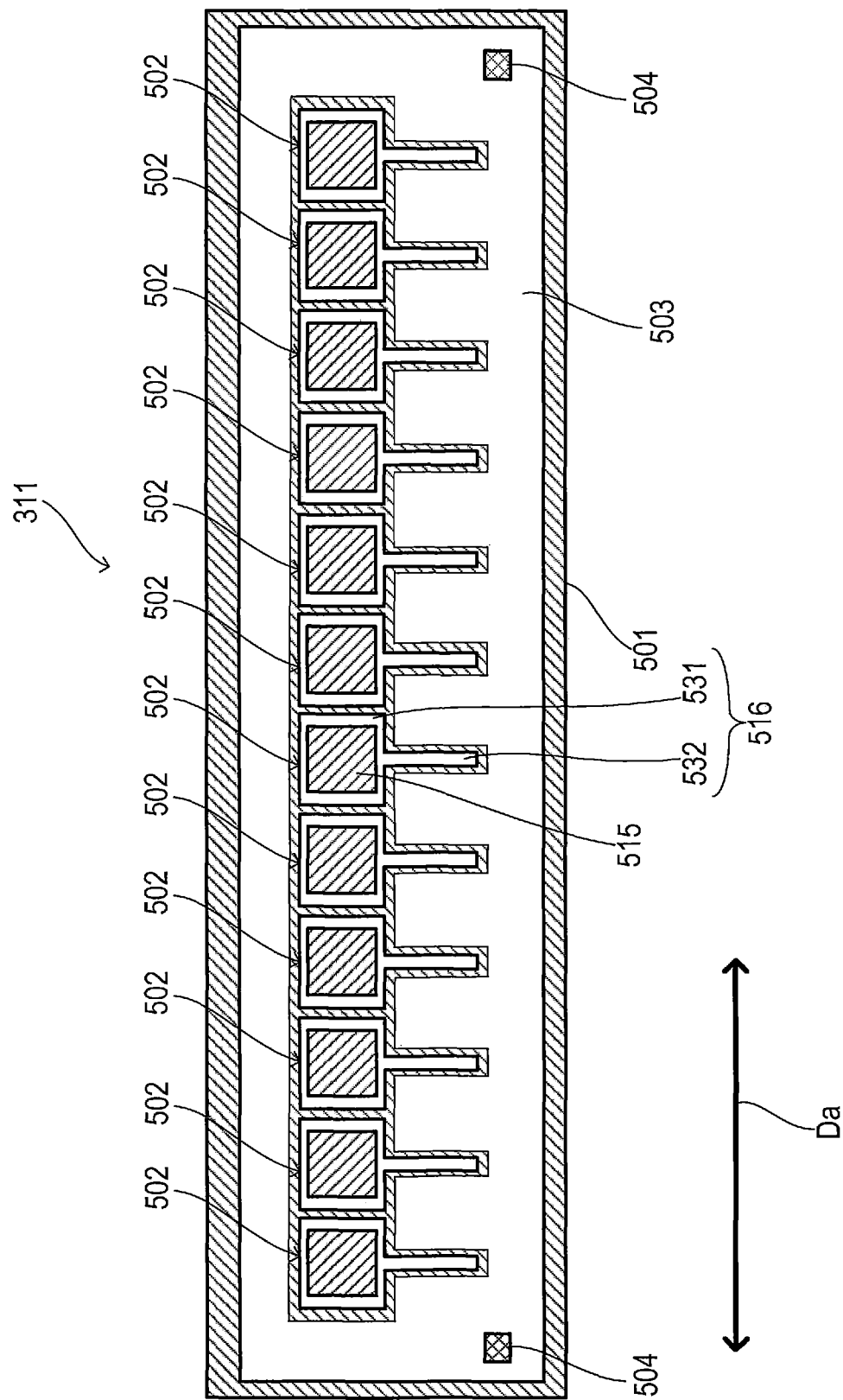
FIG. 20 is a plan view of an APD array according to a fourth embodiment.

A lidar device 1 according to the fourth embodiment is, as shown in FIG. 20, different from the lidar device according to the first embodiment in that an APD array 311 includes an unnecessary-carrier discharge electrode 503 of a different shape.

The unnecessary-carrier discharge electrode 503 of the APD array 311 according to the fourth embodiment is, as shown in FIG. 20, formed around, but not in contact with, 12 signal extraction electrodes 516 arranged in a row. However, the unnecessary-carrier discharge electrode 503 is not formed between any two adjacent frame portions 531.

In the APD array 311, the unnecessary-carrier discharge electrode 503 is not placed between any two adjacent pixel regions 521. This arrangement allows the space between every two adjacent pixel regions 521 to be narrowed, and the APD array 311 may have a smaller size.

Fifth Embodiment

A fifth embodiment of the present disclosure will now be described with reference to the drawings. In the fifth embodiment, differences from the first embodiment will be described. Common components will be given the same reference numerals.

Figure 21:
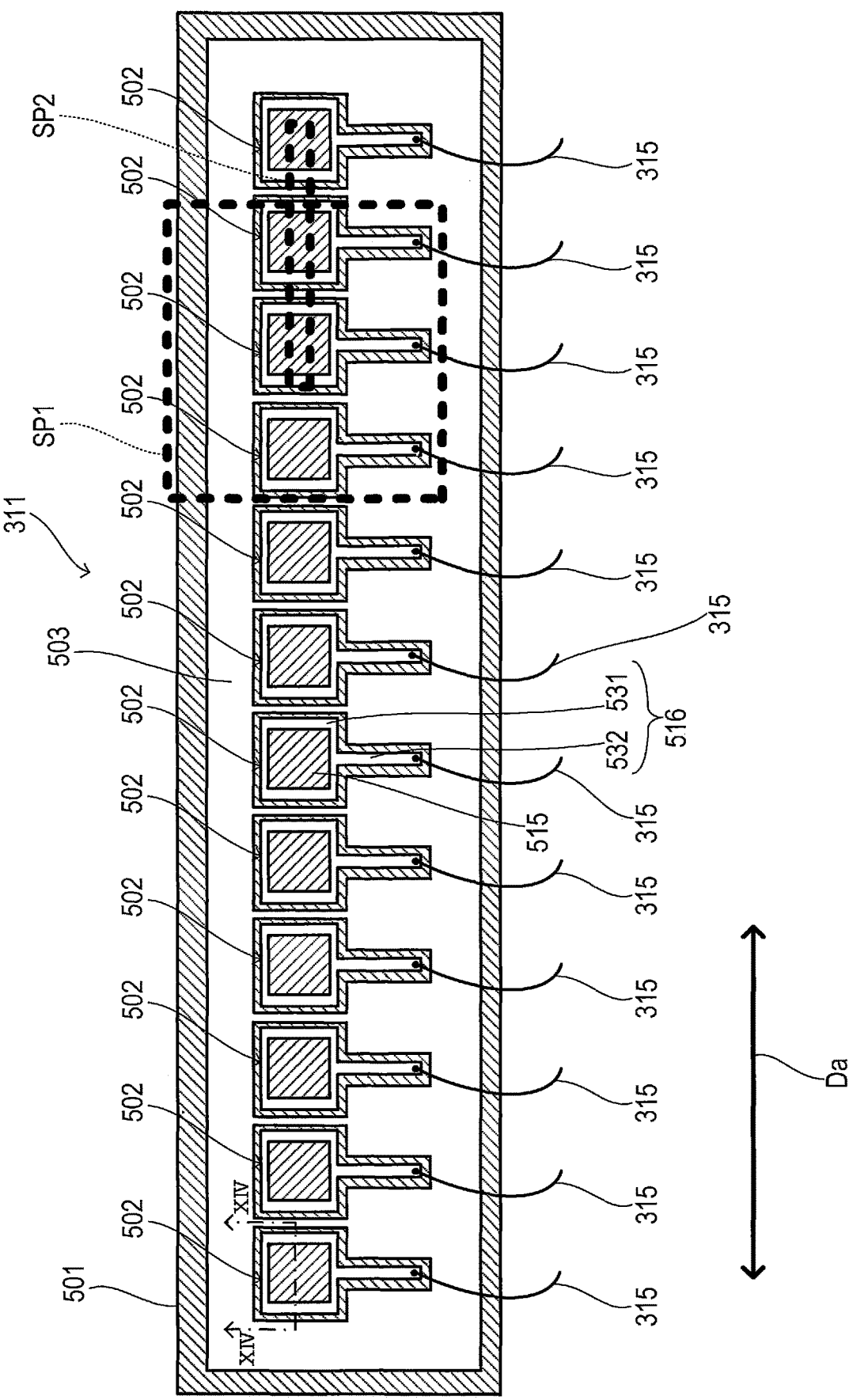
FIG. 21 is a plan view of an APD array according to a fifth embodiment.

An APD array 311 according to the fifth embodiment is, as shown in FIG. 21, formed by arranging 12 APDs 502 in a row on the front surface of a substrate 501 of a p-type semiconductor (in the present embodiment, silicon). However, the substrate 501 may be formed of an i-type semiconductor.

Figure 22:
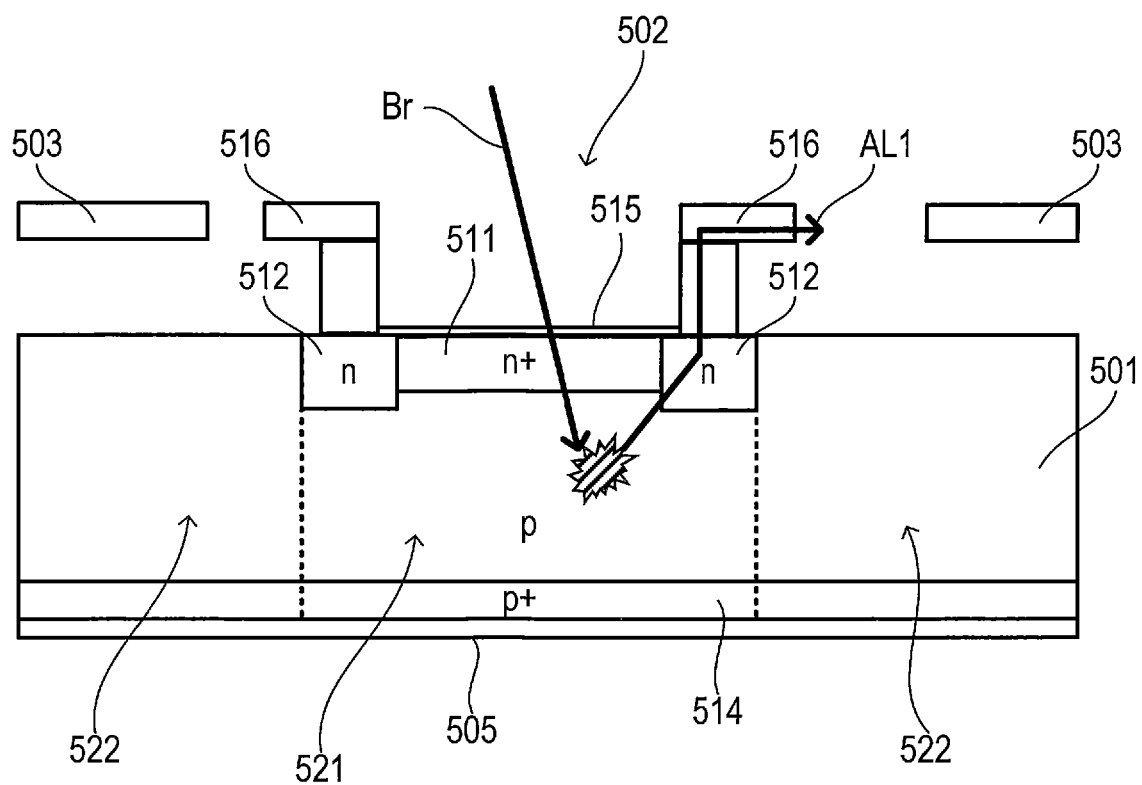
FIG. 22 is a cross-sectional view of an APD according to the fifth embodiment.

The APD array 311 includes the 12 APDs 502 and one light shielding electrode 503 on the front surface of the substrate 501. An APD 502, as shown in FIG. 22, includes an n+ region 511, an n region 512, a p+ region 514, an antireflection film 515, and a signal extraction electrode 516.

The n+ region 511 is an n-type region formed in the front surface of the substrate 501. The n+ region 511 contains a higher concentration of n-type impurities than the n region 512.

The n region 512 is an n-type region formed in the front surface of the substrate 501, and around and in contact with the n+ region 511.

The p+ region 514 is a p-type region formed in the back surface of the substrate 501. The p+ region 514 contains a higher concentration of p-type impurities than the substrate 501.

The antireflection film 515 is a film formed from, for example, silicon nitride and placed on the n+ region 511. The antireflection film 515 reduces the surface reflection of light incident on the antireflection film 515.

The signal extraction electrode 516 is an electrode formed from, for example, Al or Cu, placed on the n region 512, and electrically connected to the n region 512. The signal extraction electrode 516 receives a high voltage (e.g., 300 V).

In the substrate 501, the n+ region 511, the n region 512, and the region under the n+ region 511 and the n region 512 are hereinafter referred to as a pixel region 521. In the substrate 501, the region other than the pixel region 521 is hereinafter referred to as a pixel neighboring region 522.

The light shielding electrode 503 is an electrode formed from, for example, Al or Cu and placed opposite the pixel neighboring regions 522 with a dielectric film (not shown) between them.

The APD array 311 also includes, on the back surface of the substrate 501, a back-side electrode 505 formed from, for example, AlSiCu.

As shown in FIG. 21, the antireflection film 515 is rectangular. The signal extraction electrode 516 includes a frame portion 531 and a linear portion 532. The frame portion 531 is shaped as a rectangular frame surrounding the antireflection film 515. The linear portion 532 is shaped as a straight line extending from the frame portion 531 in a direction perpendicular to the arrangement direction Da of the 12 APDs 502.

The light shielding electrode 503 is formed around, but not in contact with, the 12 signal extraction electrodes 516 arranged in a row. The light shielding electrode 503 is also formed between every two adjacent frame portions 531 to surround each of the 12 signal extraction electrodes 516.

The linear portion 532 of the signal extraction electrode 516 is connected with a bonding wire 315 used to apply a high voltage to the signal extraction electrode 516 from outside the APD array 311.

For an APD 502 having the structure described above, as shown in FIG. 22, when a returning light beam Br passes through the antireflection film 515 and enters the pixel region 521, an electron-hole pair is generated in the pixel region 521. Then, as indicated by an arrow AL1, the electron of the electron-hole pair generated in the pixel region 521 is absorbed by the n region 512 and discharged through the signal extraction electrode 516.

Figure 23:
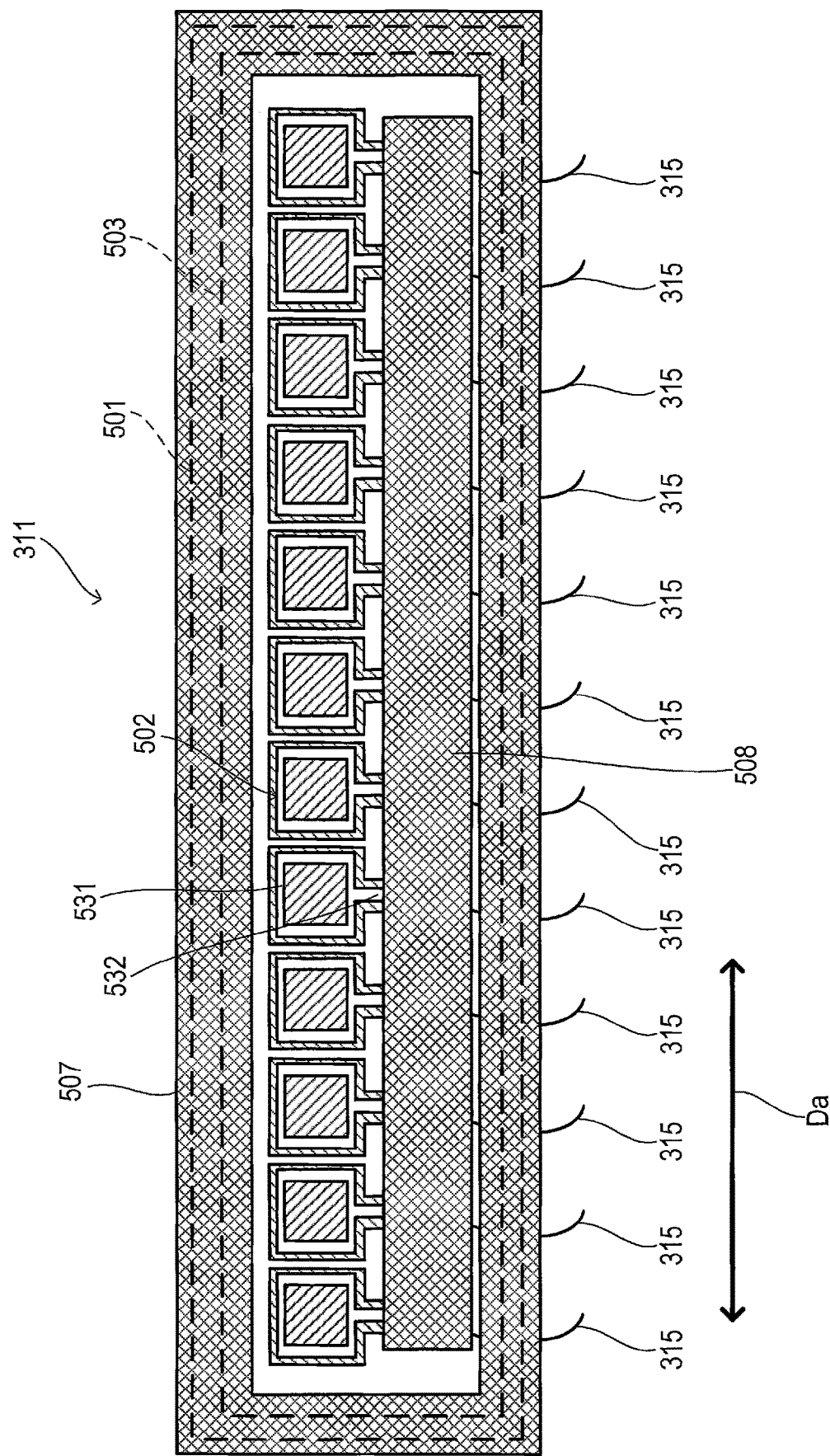
FIG. 23 is a plan view of the APD array, showing the arrangement of light shielding films.

The APD array 311, as shown in FIG. 23, also includes light shielding films 507 and 508. The light shielding films 507 and 508 are formed by applying a member (e.g., made of black potting resin) capable of attenuating, absorbing, or reflecting light within the sensitive wavelength range of the APDs 502 (e.g., a wavelength of 1.2 µm or less).

The light shielding film 507 is placed on the front surface and the side surfaces of the substrate 501 to cover the four sides of the rectangular substrate 501. The light shielding film 508 is placed on the front surface of the substrate 501 to cover the areas of the 12 linear portions 532 arranged in a row, from one end to the other end in the arrangement direction Da.

The light shielding films 507 and 508 are formed by application with the bonding wires 315 connected to the linear portions 532 of the signal extraction electrodes 516. The light shielding films 507 and 508 thus cover substantially the entire part of each bonding wire 315 on the front surface of the substrate 501.

The APD array 311 having the structure described above includes the 12 pixel regions 521, the n regions 512, the signal extraction electrodes 516, the pixel neighboring regions 522, the light shielding electrode 503, and the light shielding films 507 and 508.

The pixel regions 521 are formed in the substrate 501 and internally generate electrons and holes in accordance with the incident light. The n regions 512 are formed in the pixel regions 521 and absorb the electrons generated in the pixel regions 521 (hereinafter, discharge carriers). The signal extraction electrodes 516 are formed on the substrate 501 and allow the discharge carriers absorbed in the n regions 512 to be discharged from the n regions 512.

The pixel neighboring regions 522 are formed so as to be adjacent to the pixel regions 521 in the substrate 501 and internally generate electrons and holes in accordance with the incident light. The light shielding electrode 503 and the light shielding films 507 and 508 are formed from a member capable of blocking light with a wavelength that allows the generation of electrons and holes in the pixel neighboring regions 522, and placed so as to cover the pixel neighboring regions 522.

In this manner, the APD array 311 allows the signal extraction electrodes 516 to discharge carriers generated in the pixel regions 521 by light entry into the pixel regions 521 (hereinafter, necessary carriers). In the APD array 311, the light shielding electrode 503 and the light shielding films 507 and 508 placed so as to cover the pixel neighboring regions 522 reduce carrier generation in the pixel neighboring regions 522 caused by light entry into the pixel neighboring regions 522. Thus, the APD array 311 reduces the discharge of carriers generated in the pixel neighboring regions 522 (hereinafter, unnecessary carriers) through the signal extraction electrodes 516. More specifically, the APD array 311 reduces the inclusion of unnecessary-carrier-caused signals in signals output through the signal extraction electrodes 516.

If a pixel region 521 and a pixel neighboring region 522 receive light at the same time, the necessary carrier and the unnecessary carrier will reach the signal extraction electrode 516 at different times. Thus, the inclusion of unnecessary-carrier-caused signals in signals output through the signal extraction electrode 516 would reduce the accuracy in distance measurement. In the lidar device 1, as shown in FIG. 21, when light reflected from an object near to the lidar device 1 and received by the APD array 311 is called reflected light SP1, and light reflected from an object far from the lidar device 1 and received by the APD array 311 is called reflected light SP2, the reflected light SP1 has a spot size greater than the spot size of the reflected light SP2. For this reason, in the APD array 311, reflected light received from an object near to the APD array 311 would tend to enter a pixel neighboring region 522, generating an unnecessary carrier.

However, even when receiving light reflected from an object near to the lidar device 1, the APD array 311 reduces the inclusion of unnecessary-carrier-caused signals in signals output through the signal extraction electrodes 516 as described above. The APD array 311 thus improves the measurement accuracy of the lidar device 1.

The light shielding film 507 is an insulator member. The light shielding film 507 covers at least a portion of each pixel neighboring region 522 in the substrate 501, the portion formed in an edge of the substrate 501.

Applying high voltage to the APDs 502 generates high voltage in the edges of the substrate 501. Thus, with the edges of the substrate 501 exposed, the package for the APD array 311 would be larger in order to satisfy the creepage distance requirement defined in IEC 60950 (i.e., to ensure a predefined creepage distance). IEC 60950 is an international standard for the safety of information technology equipment.

For the APD array 311, however, the light shielding film 507 that is an insulator member covers the edges of the substrate 501. Thus, the above creepage distance requirement may be relaxed for the APD array 311, allowing the package for the APD array 311 to be smaller.

The signal extraction electrodes 516 are each connected with the bonding wires 315. The light shielding film 507 covers a portion of each bonding wire 315 in addition to the pixel neighboring regions 522. This covering in the APD array 311 reduces the exposure of the high-voltage bonding wires 315 on an edge of the substrate 501. Thus, the above creepage distance requirement may be relaxed for the APD array 311, allowing the package for the APD array 311 to be smaller.

The lidar device 1 includes the light emitting unit 10, the light receiving unit 30, and the scanning unit 20.

The light emitting unit 10 includes the light sources 11 and 12 that output light. The light receiving unit 30 includes the APD array 311 that receives light coming in a predetermined direction. The scanning unit 20 includes the reflective surface that reflects light incident from the light emitting unit 10. By rotating the reflective surface about the predefined rotation axis, the scanning unit 20 changes the emission direction of the light incident from the light emitting unit 10 along the main scanning direction orthogonal to the rotation axis direction, and reflects and guides the light reflected from a subject within a scan range to the light receiving unit 30.

The lidar device 1, which includes the APD array 311, achieves the same advantageous effects as the APD array 311.

In the embodiment described above, the APD array 311 corresponds to a photodetection element, the substrate 501 corresponds to a semiconductor substrate, the n region 512 corresponds to an absorption region, the signal extraction electrode 516 corresponds to a discharge electrode, and the light shielding electrode 503 and the light shielding films 507 and 508 correspond to light shields. Although the APDs described above are produced by n-doping a p substrate, an n substrate may be p-doped. Although described based on the cross section of reach-through devices, which may have a thicker depletion layer, the above embodiment may be applied to reverse-type devices, which cannot have a thick depletion layer compared with reach-through devices. The above embodiment may be applied not only to APDs, but also to photodiodes with no multiplication effect or single-photon avalanche diodes with quite a high multiplication factor.

Sixth Embodiment

A sixth embodiment of the present disclosure will now be described with reference to the drawings. In the sixth embodiment, differences from the fifth embodiment will be described. Common components will be given the same reference numerals.

Figure 24:
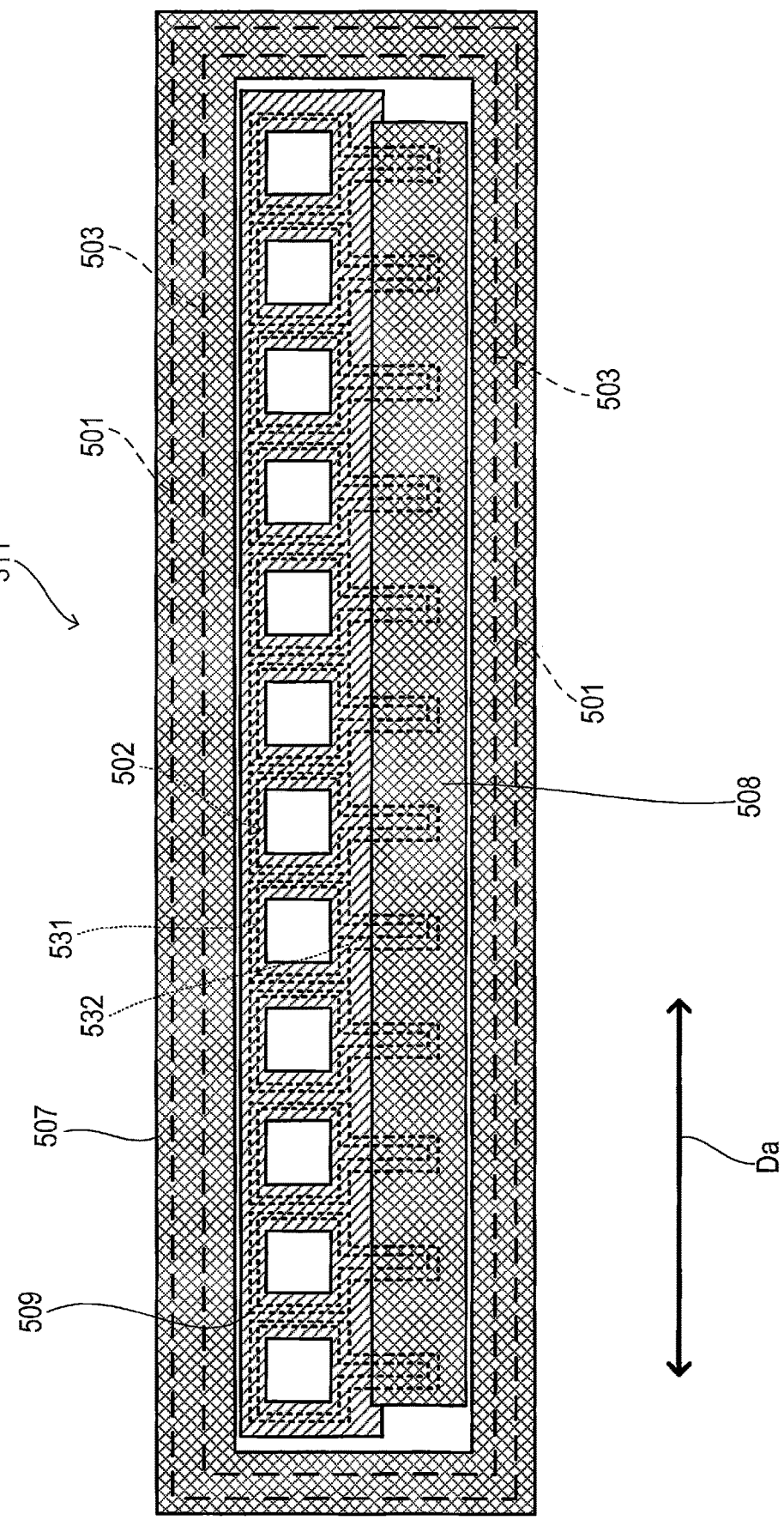
FIG. 24 is a plan view of an APD array according to a sixth embodiment.
Figure 25:
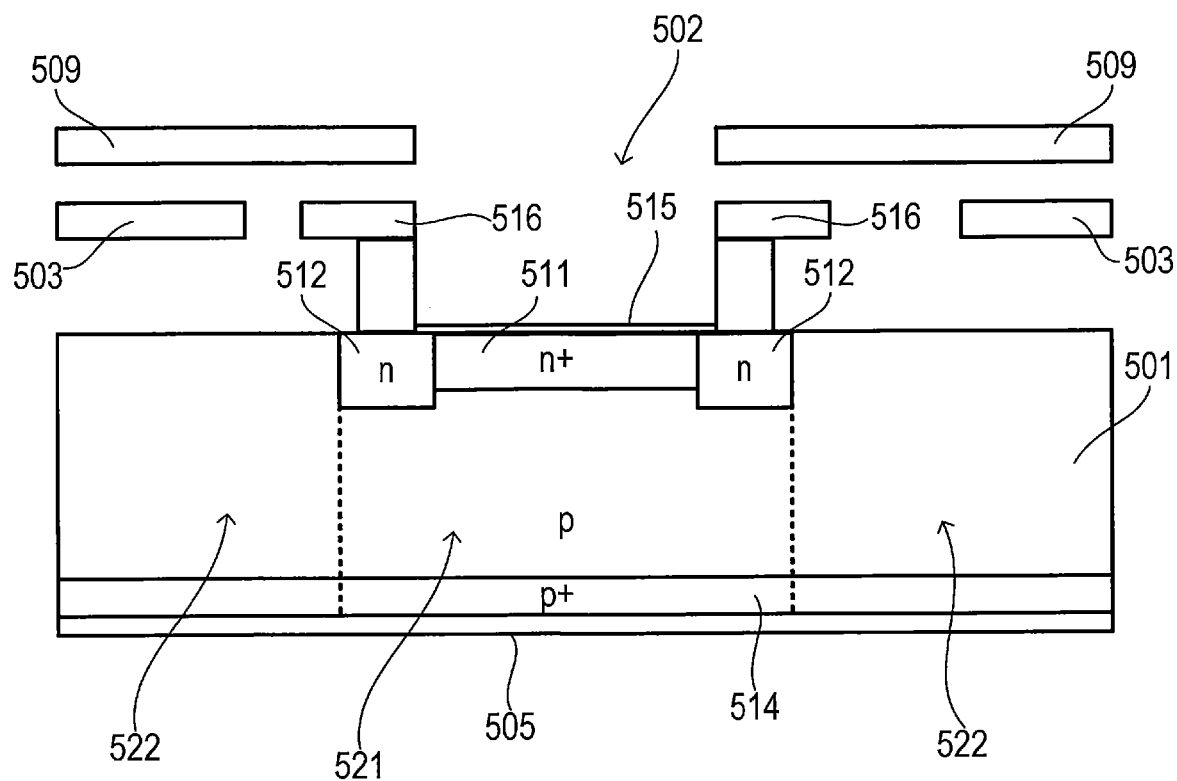
FIG. 25 is a cross-sectional view of an APD according to the sixth embodiment.

A lidar device 1 according to the sixth embodiment, as shown in FIGS. 24 and 25, is different from the lidar device according to the fifth embodiment in that an APD array 311 additionally includes a light shielding electrode 509.

The light shielding electrode 509 is an electrode formed from, for example, Al or Cu and, as shown in FIG. 24, and is placed on the front surface of the substrate 501 to cover the areas of 12 frame portions 531 arranged in a row, from one end to the other end in the arrangement direction Da. However, the light shielding electrode 509 has openings opposite the 12 antireflection films 515 arranged in a row. The light shielding electrode 509 is, as shown in FIG. 25, placed opposite the light shielding electrode 503 and the signal extraction electrode 516 with a dielectric film (not shown) between them.

The APD array 311 having the structure described above includes the light shielding electrode 509. The light shielding electrode 509 is formed of metal capable of blocking light with a wavelength that allows the generation of electrons and holes in the pixel neighboring regions 522. The light shielding electrode 509 is electrically isolated from the signal extraction electrodes 516 of every two adjacent pixel regions 521 and is placed so as to cover the gap between the signal extraction electrodes 516 of every two adjacent pixel regions 521.

This arrangement enables the APD array 311 to reduce light incident on the pixel neighboring region 522 formed between every two adjacent pixel regions 521. As a result, the APD array 311 further reduces the inclusion of unnecessary-carrier-caused signals in signals output through the signal extraction electrode 516, thus further improving the measurement accuracy of the lidar device 1.

In the embodiment described above, the light shielding electrode 509 corresponds to light shielding metal.

Seventh Embodiment

A seventh embodiment of the present disclosure will now be described with reference to the drawings. In the seventh embodiment, differences from the fifth embodiment will be described. Common components will be given the same reference numerals.

Figure 26:
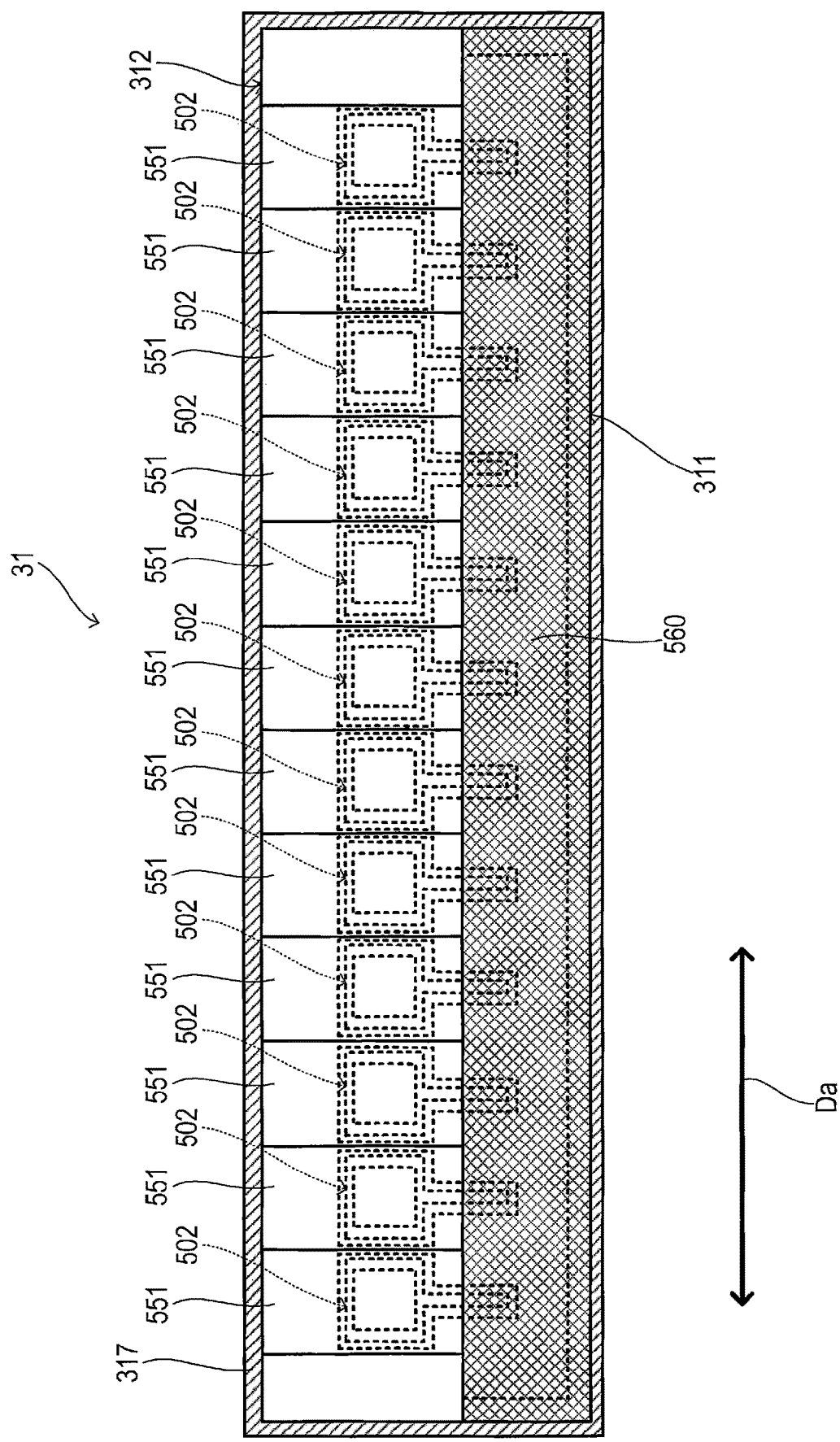
FIG. 26 is a plan view of an APD array according to a seventh embodiment.

A lidar device 1 according to the seventh embodiment is, as shown in FIG. 26, different from the fifth embodiment in that the light shielding films 507 and 508 are removed, and a lens array 312, a light shield 317, and a light shielding film 560 are added.

Figure 27:
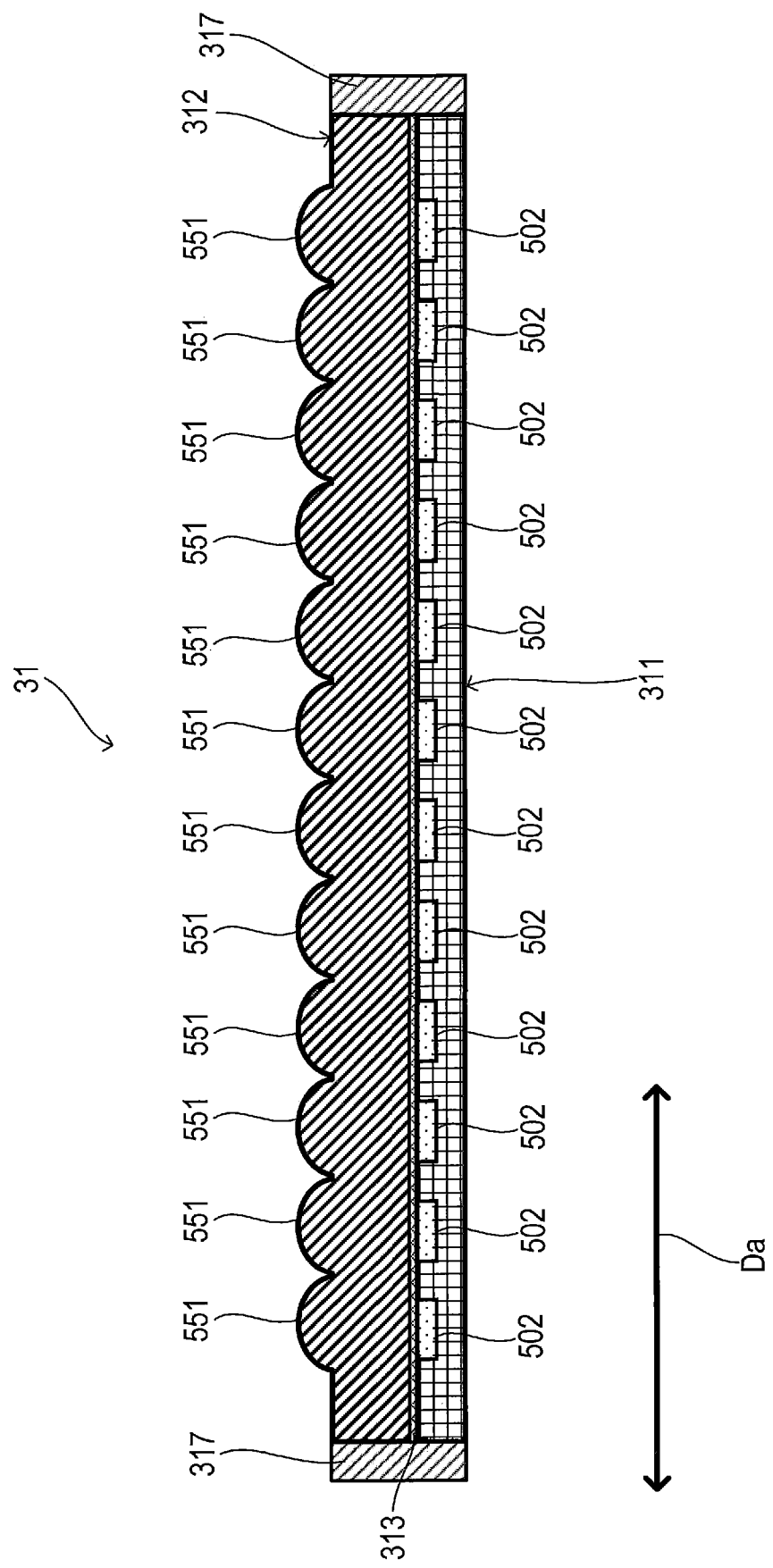
FIG. 27 is a plan view of a light receiving element according to the seventh embodiment.

A light receiving element 31 according to the seventh embodiment further includes the lens array 312 and the light shield 317. The lens array 312 includes 12 lenses facing 12 APDs 502 for the APD array 311 on a one-to-one basis, and narrows light incident on the light receiving element 31 and guides the light to each APD 502. The lens array 312 is, as shown in FIGS. 26 and 27, formed by arranging 12 convex lenses 551 in a row in the arrangement direction Da of the APDs 502. The convex lenses 551 are formed from, for example, glass or silicone resin. As shown in FIG. 27, the lens array 312 is fixed to the APD array 311 via an adhesive layer 313 to cover the APDs 502. The adhesive layer 313 is formed from a material that cures when exposed to ultraviolet radiation. The adhesive layer 313 is also formed from a material having substantially the same transmittance as the transmittance of the convex lenses 551 and antireflection films 515. As shown in FIG. 26, the 12 convex lenses 551 are placed opposite the antireflection films 515 of the 12 APDs 502. Each of the 12 convex lenses 551 narrows light incident on the convex lens 551 and guides the light to the corresponding APD 502.

The light shield 317 is, for example, formed from silicone resin, epoxy resin, or acrylic resin mixed or painted with a member capable of absorbing light within the sensitive wavelength range of the APDs 502. The light shield 317 is, as shown in FIGS. 26 and 27, placed on the side surfaces of the substrate 501 to cover the four sides of the rectangular substrate 501. As a result, the light shield 317 is placed on side surfaces of the lens array 312 and covers three of the four sides of the rectangular lens array 312 that are also included in the rectangle of the substrate 501.

The APD array 311 according to the seventh embodiment, as shown in FIG. 26, further includes the light shielding film 560. The light shielding film 560 is formed, in the same manner as the light shielding films 507 and 508, by applying a member capable of attenuating, absorbing, or reflecting light within the sensitive wavelength range of the APDs 502. The light shielding film 560 is placed on the front surface of the substrate 501 to cover an area other than the lens array 312.

The APD array 311 having the structure described above includes the convex lenses 551 placed opposite the pixel regions 521 over the substrate 501. This arrangement enables light incident on the convex lenses 551 to be narrowed and guided to the pixel regions 521, so that the APD array 311 can have a higher effective aperture ratio to incident light and also reduce light incident on the pixel neighboring regions 522.

The light incident surface of the convex lenses 551 for receiving light includes a light incident surface incapable of guiding incident light to the pixel regions 521 (in the present embodiment, the side surfaces of the lens array 312), and at least a portion of the surface incapable of guiding incident light is covered with the light shielding film 560 capable of blocking light with a wavelength that allows the generation of electrons and holes in the pixel neighboring regions 522.

This arrangement enables the APD array 311 to reduce light incident on the pixel neighboring regions 522. As a result, the APD array 311 further reduces the inclusion of unnecessary-carrier-caused signals in signals output through the signal extraction electrode 516, thus further improving the measurement accuracy of the lidar device 1.

In the embodiment described above, the light shielding film 560 corresponds to a lens light shield.

The embodiments of the present disclosure have been described. However, the present disclosure is not limited to the above embodiments, but may be implemented in various modified embodiments.

First Modification

Although the substrate 501 is p-type, and the n region 512 and the n region 513 are n-type in the above embodiments, for example, the substrate 501 may be n-type or i-type, and the n region 512 and the n region 513 may be p-type. In this case, carriers discharged through the signal extraction electrode 516 are holes.

Second Modification

Although the substrate 501 in the above embodiments is formed from silicon, the material for the substrate 501 is not limited to silicon as long as it is a semiconductor. The substrate 501 may be formed from, for example, InGaAs.

Third Modification

Although the substrate 501 is p-type, and the n region 512 is n-type in the above embodiments, for example, the substrate 501 may be n-type or i-type, and the n region 512 may be p-type. In this case, carriers discharged through the signal extraction electrode 516 are holes.

Fourth Modification

Although the substrate 501 in the above embodiments is formed from silicon, the material for the substrate 501 is not limited to silicon as long as it is a semiconductor. The substrate 501 may be formed from, for example, InGaAs. In this case, the APDs have a sensitive wavelength range of 3 μm or less (i.e., wavelengths from visible light to mid-infrared light).

In some cases, a plurality of components may share the functions of one component in the above embodiments. In other cases, one component may implement functions of a plurality of components. Some of the components in the above embodiments may be omitted. At least some components in one of the above embodiments may be added to or substituted for components in another of the above embodiments.

An aspect of the present disclosure is a photodetection element (311) including at least one pixel region (521), a first absorption region (512), a first discharge electrode (516), a pixel neighboring region (522), a second absorption region (513), and a second discharge electrode (503).

The pixel region is formed in a semiconductor substrate (501) and internally generates an electron and a hole in accordance with the incident light.

The first absorption region is formed in the pixel region and absorbs a first discharge carrier that is either of the electron and the hole generated in the pixel region.

The first discharge electrode is formed on the semiconductor substrate and discharges, from the first absorption region, the first discharge carrier absorbed in the first absorption region.

The pixel neighboring region is formed so as to be adjacent to the pixel region in the semiconductor substrate and internally generates an electron and a hole in accordance with the incident light.

The second absorption region is formed in the pixel neighboring region and absorbs a second discharge carrier that is the same carrier of either of the electron and the hole generated in the pixel neighboring region, as the first discharge carrier.

The second discharge electrode is formed on the semiconductor substrate and discharges, from the second absorption region, the second discharge carrier absorbed in the second absorption region.

The photodetection element according to the present disclosure having the above configuration allows the first discharge electrode to discharge carriers generated in the pixel region by light entry into the pixel region (hereinafter, necessary carriers), and the second discharge electrode to discharge carriers generated in the pixel neighboring region by light entry into the pixel neighboring region (hereinafter, unnecessary carriers). Thus, the photodetection element according to the present disclosure reduces the discharge of unnecessary carriers through the first discharge electrode. More specifically, the photodetection element according to the present disclosure reduces the inclusion of unnecessary-carrier-caused signals in signals output from through the first discharge electrode.

If the pixel region and the pixel neighboring region receive light at the same time, the necessary carrier and the unnecessary carrier will reach the first discharge electrode at different times. Thus, the inclusion of unnecessary-carrier-caused signals in signals output from the first discharge electrode would reduce the accuracy in distance measurement. In the lidar device, light reflected from an object near to the lidar device and received by the photodetection element according to the present disclosure has a spot size greater than the spot size of light reflected from an object far from the lidar device and received by the photodetection element according to the present disclosure. For this reason, in the photodetection element according to the present disclosure, reflected light received from an object near to the lidar device would tend to enter the pixel neighboring region, generating an unnecessary carrier.

However, even when receiving light reflected from an object near to the lidar device, the photodetection element according to the present disclosure reduces the inclusion of unnecessary-carrier-caused signals in signals output through the first discharge electrode as described above. The photodetection element according to the present disclosure thus improves the measurement accuracy of the lidar device.

Another aspect of the present disclosure is a lidar device (1) including a light emitting unit (10), a light receiving unit (30), and a scanning unit (20). The light emitting unit includes a light source that outputs light. The light receiving unit includes a photodetection element that receives light arriving from a predetermined direction. The scanning unit includes a reflective surface for reflecting light incident from the light emitting unit. By rotating the reflective surface about a predefined rotation axis, the scanning unit changes the emission direction of light incident from the light emitting unit along the main scanning direction orthogonal to the rotation axis direction, and reflects and guides light reflected from a subject within a scan range to the light receiving unit.

The photodetection element includes at least one pixel region, a first absorption region, a first discharge electrode, a pixel neighboring region, a second absorption region, and a second discharge electrode.

The lidar device according to the present disclosure having the above configuration, which includes the photodetection element according to the aspect of the present disclosure, achieves the same advantageous effects as the photodetection element according to the present disclosure.

Still another aspect of the present disclosure is a photodetection element including at least one pixel region (521), an absorption region (512), a discharge electrode (516), a pixel neighboring region (522), and a light shield (503, 507, 508).

The pixel region is formed in a semiconductor substrate (501) and internally generates an electron and a hole in accordance with the incident light.

The absorption region is formed in the pixel region and absorbs a discharge carrier that is either of the electron and the hole generated in the pixel region.

The discharge electrode is formed on the semiconductor substrate and discharges, from the absorption region, the discharge carrier absorbed in the absorption region.

The pixel neighboring region is formed so as to be adjacent to the pixel region in the semiconductor substrate and internally generates an electron and a hole in accordance with the incident light.

The light shield is formed from a member capable of blocking light with a wavelength allowing the generation of the electron and the hole in the pixel neighboring region, and is placed so as to cover the pixel neighboring region.

The photodetection element according to the present disclosure having the above configuration allows the discharge electrode to discharge carriers generated in the pixel region by light entry into the pixel region (hereinafter, necessary carriers). In the photodetection element of the present disclosure, the light shield placed so as to cover the pixel neighboring region reduces carrier generation in the pixel neighboring region caused by light entry into the pixel neighboring region. Thus, the photodetection element according to the present disclosure reduces the discharge of carriers generated in the pixel neighboring region (hereinafter, unnecessary carriers) through the discharge electrode. More specifically, the photodetection element according to the present disclosure reduces the inclusion of unnecessary-carrier-caused signals in signals output through the discharge electrode.

If the pixel region and the pixel neighboring region were to receive light at the same time, the necessary carrier and the unnecessary carrier would reach the discharge electrode at different times. Thus, the inclusion of unnecessary-carrier-caused signals in signals output from the discharge electrode would reduce the accuracy in distance measurement. In the lidar device, light reflected from an object near to the lidar device and received by the photodetection element according to the present disclosure has a spot size greater than the spot size of light reflected from an object far from the lidar device and received by the photodetection element according to the present disclosure. For this reason, in the photodetection element according to the present disclosure, reflected light received from an object near to the lidar device would tend to enter the pixel neighboring region, generating an unnecessary carrier.

However, even when receiving light reflected from an object near to the lidar device, the photodetection element according to the present disclosure reduces the inclusion of unnecessary-carrier-caused signals in signals output through the discharge electrode as described above. The photodetection element according to the present disclosure thus improves the measurement accuracy of the lidar device.

Still another aspect of the present disclosure is a lidar device (1) including a light emitting unit (10), a light receiving unit (30), and a scanning unit (20). The light emitting unit includes a light source that outputs light. The light receiving unit includes a photodetection element that receives light coming in a predetermined direction. The scanning unit includes a reflective surface for reflecting light incident from the light emitting unit. By rotating the reflective surface about a predefined rotation axis, the scanning unit changes the emission direction of light incident from the light emitting unit along the main scanning direction orthogonal to the rotation axis direction, and reflects and guides light reflected from a subject within a scan range to the light receiving unit.

The photodetection element includes at least one pixel region, an absorption region, a discharge electrode, a pixel neighboring region, and a light shield.

The lidar device according to the present disclosure having the above configuration, which includes the photodetection element according to the above aspect of the present disclosure, achieves the same advantageous effects as the photodetection element according to the present disclosure.

What is claimed is:

1. A photodetection element comprising:
   at least one pixel region formed in a semiconductor substrate and configured to internally generate an electron and a hole in accordance with incident light;
   an absorption region formed in the pixel region and configured to absorb a discharge carrier, the discharge carrier being either of the electron and the hole generated in the pixel region;
   a discharge electrode formed on the semiconductor substrate and configured to discharge, from the absorption region, the discharge carrier absorbed in the absorption region;
   a pixel neighboring region formed so as to be adjacent to the pixel region in the semiconductor substrate and configured to internally generate an electron and a hole in accordance with incident light; and
   a light shield formed from a member capable of blocking light with a wavelength allowing generation of the electron and the hole in the pixel neighboring region, the light shield being placed so as to cover the pixel neighboring region,
   wherein
   the light shield is an insulator member, and
   the light shield covers at least a portion of the pixel neighboring region in the semiconductor substrate, the portion formed in an edge of the semiconductor substrate, and wherein
   the discharge electrode is connected with a bonding wire, and
   the light shield covers a portion of the bonding wire in addition to the pixel neighboring region.

2. The photodetection element according to claim 1, wherein
   the at least one pixel region comprises two or more pixel regions, and
   the photodetection element comprises
   a light shielding metal electrically isolated from respective discharge electrodes of two pixel regions of the two or more pixel regions that are adjacent to each other and placed so as to cover a gap between the discharge electrodes of the two pixel regions adjacent to each other, the light shielding metal being formed of metal capable of blocking light with a wavelength allowing generation of the electron and the hole in the pixel neighboring region.

3. The photodetection element according to claim 1, further comprising
   a convex lens placed opposite the pixel region over the semiconductor substrate.

4. The photodetection element according to claim 3, wherein
   the convex lens has a light incident surface for receiving light, the light incident surface including a light incident surface incapable of guiding incident light to the pixel region, with at least a portion of the incapable light incident surface covered with a lens light shield capable of blocking light with a wavelength allowing generation of the electron and the hole in the pixel neighboring region.

5. A lidar device comprising:
   a light emitting unit including a light source configured to output light;
   a light receiving unit including a photodetection element configured to receive light coming in a predetermined direction; and a scanning unit including a reflective surface for reflecting light incident from the light emitting unit and configured to, by rotating the reflective surface about a predefined rotation axis, change an emission direction of light incident from the light emitting unit along a main scanning direction orthogonal to an axis direction of the rotation axis, and reflect and guide light reflected from a subject within a scan range to the light receiving unit, wherein the photodetection element includes at least one pixel region formed in a semiconductor substrate and configured to internally generate an electron and a hole in accordance with incident light, an absorption region formed in the pixel region and configured to absorb a discharge carrier, the discharge carrier being either of the electron and the hole generated in the pixel region, a discharge electrode formed on the semiconductor substrate and configured to discharge, from the absorption region, the discharge carrier absorbed in the absorption region, a pixel neighboring region formed so as to be adjacent to the pixel region in the semiconductor substrate and configured to internally generate an electron and a hole in accordance with incident light, and a light shield formed from a member capable of blocking light with a wavelength allowing generation of the electron and the hole in the pixel neighboring region, the light shield being placed so as to cover the pixel neighboring region, wherein the light shield is an insulator member, and the light shield covers at least a portion of the pixel neighboring region in the semiconductor substrate, the portion formed in an edge of the semiconductor substrate, and wherein the discharge electrode is connected with a bonding wire, and the light shield covers a portion of the bonding wire in addition to the pixel neighboring region.

6. The lidar device according to claim 5, wherein the at least one pixel region comprises two or more pixel regions, and the photodetection element comprises a light shielding metal electrically isolated from respective discharge electrodes of two pixel regions of the two or more pixel regions that are adjacent to each other and placed so as to cover a gap between the discharge electrodes of the two pixel regions adjacent to each other, the light shielding metal being formed of metal capable of blocking light with a wavelength allowing generation of the electron and the hole in the pixel neighboring region.

7. The lidar device according to claim 5, further comprising a convex lens placed opposite the pixel region over the semiconductor substrate.

8. The lidar device according to claim 7, wherein the convex lens has a light incident surface for receiving light, the light incident surface including a light incident surface incapable of guiding incident light to the pixel region, with at least a portion of the incapable light incident surface covered with a lens light shield capable of blocking light with a wavelength allowing generation of the electron and the hole in the pixel neighboring region.

9. A photodetection element comprising:

at least one pixel region formed in a semiconductor substrate and configured to internally generate an electron and a hole in accordance with incident light;

an absorption region formed in the pixel region and configured to absorb a discharge carrier, the discharge carrier being either of the electron and the hole generated in the pixel region;

a discharge electrode formed on the semiconductor substrate and configured to discharge, from the absorption region, the discharge carrier absorbed in the absorption region;

a pixel neighboring region formed so as to be adjacent to the pixel region in the semiconductor substrate and configured to internally generate an electron and a hole in accordance with incident light; and a light shield formed from a member capable of blocking light with a wavelength allowing generation of the electron and the hole in the pixel neighboring region, the light shield being placed so as to cover the pixel neighboring region, wherein the at least one pixel region comprises two or more pixel regions, and the photodetection element comprises a light shielding metal electrically isolated from respective discharge electrodes of two pixel regions of the two or more pixel regions that are adjacent to each other and placed so as to cover a gap between the discharge electrodes of the two pixel regions adjacent to each other, the light shielding metal being formed of metal capable of blocking light with a wavelength allowing generation of the electron and the hole in the pixel neighboring region.

10. The photodetection element according to claim 9, further comprising a convex lens placed opposite the pixel region over the semiconductor substrate.

11. The photodetection element according to claim 10, wherein the convex lens has a light incident surface for receiving light, the light incident surface including a light incident surface incapable of guiding incident light to the pixel region, with at least a portion of the incapable light incident surface covered with a lens light shield capable of blocking light with a wavelength allowing generation of the electron and the hole in the pixel neighboring region.

12. A lidar device comprising:

a light emitting unit including a light source configured to output light;

a light receiving unit including a photodetection element configured to receive light coming in a predetermined direction; and a scanning unit including a reflective surface for reflecting light incident from the light emitting unit and configured to, by rotating the reflective surface about a predefined rotation axis, change an emission direction of light incident from the light emitting unit along a main scanning direction orthogonal to an axis direction of the rotation axis, and reflect and guide light reflected from a subject within a scan range to the light receiving unit, wherein the photodetection element includes at least one pixel region formed in a semiconductor substrate and configured to internally generate an electron and a hole in accordance with incident light, an absorption region formed in the pixel region and configured to absorb a discharge carrier, the discharge carrier being either of the electron and the hole generated in the pixel region,
a discharge electrode formed on the semiconductor substrate and configured to discharge, from the absorption region, the discharge carrier absorbed in the absorption region,
a pixel neighboring region formed so as to be adjacent to the pixel region in the semiconductor substrate and configured to internally generate an electron and a hole in accordance with incident light, and
a light shield formed from a member capable of blocking light with a wavelength allowing generation of the electron and the hole in the pixel neighboring region, the light shield being placed so as to cover the pixel neighboring region, wherein
the at least one pixel region comprises two or more pixel regions, and
the photodetection element comprises
a light shielding metal electrically isolated from respective discharge electrodes of two pixel regions of the two or more pixel regions that are adjacent to each other and placed so as to cover a gap between the discharge electrodes of the two pixel regions adjacent to each other, the light shielding metal being formed of metal capable of blocking light with a wavelength allowing generation of the electron and the hole in the pixel neighboring region.

13. The photodetection element according to claim 12, further comprising
a convex lens placed opposite the pixel region over the semiconductor substrate.

14. The photodetection element according to claim 13, wherein
the convex lens has a light incident surface for receiving light, the light incident surface including a light incident surface incapable of guiding incident light to the pixel region, with at least a portion of the incapable light incident surface covered with a lens light shield capable of blocking light with a wavelength allowing generation of the electron and the hole in the pixel neighboring region.

* * * * *